(12) United States Patent
Takata et al.

(10) Patent No.: US 7,820,515 B2
(45) Date of Patent: Oct. 26, 2010

(54) NONVOLATILE SEMICONDUCTOR MEMORY ELEMENT EXCELLENT IN CHARGE RETENTION PROPERTIES AND PROCESS FOR PRODUCING THE SAME

(75) Inventors: Masaaki Takata, Chiyoda-ku (JP);
Mitsumasa Koyanagi, Sendai (JP)

(73) Assignees: Asahi Glass Company, Limited, Tokyo (JP); Tohoku University, Sendai-shi (JP)

( * ) Notice: Subject to any disclaimer, the term of this patent is extended or adjusted under 35 U.S.C. 154(b) by 163 days.

(21) Appl. No.: 12/046,763

(22) Filed: Mar. 12, 2008

(65) Prior Publication Data
US 2008/0171411 A1    Jul. 17, 2008

Related U.S. Application Data

(63) Continuation of application No. PCT/JP2006/317885, filed on Sep. 8, 2006.

(30) Foreign Application Priority Data
Sep. 12, 2005    (JP)    ............... 2005-263792

(51) Int. Cl.
*H01L 21/336*    (2006.01)
(52) U.S. Cl. .................. 438/288; 438/216; 438/287; 257/E21.423; 257/E21.679
(58) Field of Classification Search ............ 438/201, 438/211, 216, 257, 275, 287, 288, 260; 257/E21.21, 257/E21.675, E21.679, E21.625, E21.423
See application file for complete search history.

(56) References Cited

U.S. PATENT DOCUMENTS 6,208,000 B1    3/2001    Tanamoto et al.

| 7,208,365 B2* | 4/2007 | Chae et al. ............ 438/201 |
|---|---|---|
| 2005/0122775 A1 | 6/2005 | Koyanagi et al. |

FOREIGN PATENT DOCUMENTS

| EP | 1 536 483 A1 | 7/2003 |
|---|---|---|
| JP | 11-186421 | 7/1999 |
| JP | 11-330273 A | 11/1999 |
| JP | 2003-51498 A | 2/2003 |
| JP | 2003-86715 A | 3/2003 |
| JP | 2004-6884 A | 1/2004 |
| JP | 2004-55969 A | 2/2004 |

* cited by examiner

*Primary Examiner*—Julio J Maldonado
(74) *Attorney, Agent, or Firm*—Oblon, Spivak, McClelland, Maier & Neustadt, L.L.P.

(57) ABSTRACT

A process for producing a nonvolatile semiconductor memory having a mixed or laminated structure of a hardly oxidizable material composed of a hardly oxidizable element having Gibbs' free energy for forming oxide higher than that of Si under the same temperature condition at 1 atm and in temperature range of 0° C. to 1,200° C. and an oxide of an easily oxidizable material composed of an element having Gibbs' free energy for forming oxide lower than that of Si under the same temperature condition at 1 atm in the temperature range and Si. The process includes forming a portion of the hardly oxidizable material and a portion of the oxide by physical forming method and carrying out heat treatment in oxidizing and reducing gas mixture. The ratio of the gases and the temperature are controlled so that the hardly oxidizable material is reduced and the oxide is oxidized in the temperature range.

6 Claims, 13 Drawing Sheets

NONVOLATILE SEMICONDUCTOR MEMORY ELEMENT EXCELLENT IN CHARGE RETENTION PROPERTIES AND PROCESS FOR PRODUCING THE SAME

TECHNICAL FIELD

The present invention relates to a nonvolatile semiconductor memory element excellent in charge retention properties, which has a construction constituted by a plurality of materials containing elements having different Gibbs' formation free energies for forming oxides, that are different from one another by a difference in a level of the difference between those of Si and a transition metal such as Ni, W or Co; and to a process for producing such a device. The present invention particularly relates to a nonvolatile semiconductor memory element excellent in charge retention properties, which has the above construction constituted by a hardly oxidizable material and an oxide of easily oxidizable material, which is produced by decreasing defects in the oxide due to oxygen-shortage such as oxygen-shortage type defects or free valencies, by oxidation, and reducing the hardly oxidizable material. Hereinafter Gibbs' formation free energy for forming an oxide is also simply referred to as oxide formation free energy.

BACKGROUND ART

Heretofore, for portable information terminal devices such as cell phones, flash memories are widely used as memory devices capable of memorizing in a nonvolatile manner. The reason is that high density integration of flash memory is relatively easy, production technique for flash memory is highly compatible with those of conventional logic or DRAM devices, and cost of flash memory is relatively low. However, it is not easy to form a thin film of insulator surrounding a floating gate of a flash memory.

In order to secure charge retention of floating gate, that is, reliability of memory retention of flash memory, it is necessary to make the film thickness of the insulator surrounding a floating gate at least a predetermined thickness. Thus, since forming of thin film of insulator is difficult, in a flash memory of conventional structure, progress toward high performance of device such as miniaturization, high speed, low voltage operation and low power consumption, becomes difficult, and there is a prediction that progress toward high performance reaches a limit as early as year 2007.

As a technique solving the above problem of securing reliability of charge retention and achieving a thin film of insulator at the same time in a single floating gate type flash memory, a technique of dividing the floating gate into a plurality of pieces, has been proposed. As an example of specific method for dividing a floating gate into a plurality of pieces, there is a method of forming a large number of Si ultrafine particles for each memory element and using a group of such Si ultrafine particles as a floating gate (for example, Patent Document 1). By thus dividing a floating gate, even when leakage of retained charge occurs, loss of accumulated electric charge can be limited to a small region, whereby requirement for reliability of insulator can be eased. A flash memory having such a floating gate divided into a plurality of pieces is referred to as a divided floating gate type flash memory, and the above-mentioned flash memory of conventional structure is referred to as a is single floating gate type flash memory in this document.

The technique of dividing a floating gate contributes to improvement of reliability of charge retention of an insulator, and enables forming of a thin film of insulator, and for this reason, the technique is one of techniques for solving the above-mentioned problem of conventional single floating gate type flash memory.

Further, a technique is studied, in which the ultrafine particles serving as a floating gate is not made of Si but made of a metal. It is known that a floating gate constituted by metal ultrafine particles can improve charge retention performance more than Si ultrafine particle floating gate (for example, Patent document 2). The reason is because metal has a work function relatively larger than the electron affirmity of Si, and accordingly, a potential barrier for electric charge retained in the metal ultrafine particle floating gate is higher than that for electric charge in the Si ultrafine particle floating gate.

Here, in the technique for forming a metal ultrafine particle floating gate disclosed in Patent Document 2, an insulation film (hereinafter referred to as gate insulation film) deposited between the metal ultrafine particle floating gate and a control gate, is formed by a CVD method, there is a case where the metal ultrafine particles are oxidized at a time of forming the gate insulation film. It is pointed out that when the metal ultrafine particles are thus oxidized, the number of metal ultrafine particles effectively working for charge retention may decrease.

As a technique for preventing such an oxidation of metal ultrafine particles, a technique of forming a gate insulation film by using a sputtering method is disclosed (for example, Patent Document 3). Since a sputtering method enables to form a film at a lower temperature as compared with a CVD method or a thermal oxidation method in general, and accordingly, it becomes possible to deposit a gate insulation film on the metal ultrafine particles while oxidation of the metal ultrafine particles is suppressed.

Patent Document 1: JP-A-11-186421
Patent Document 2: JP-A-2003-51498
Patent Document 3: JP-A-2003-86715

DISCLOSURE OF THE INVENTION

Problems to be Solved by the Invention

However in such a conventional producing technique of nonvolatile semiconductor memory element employing a sputtering method, an insulator such as $SiO_2$ formed by a sputtering method, usually has high density of oxygen-shortage type defects and has a composition ratio of excess Si in many cases. Further, since many free valencies (dangling bonds) are contained, there is a problem that such an insulator has low insulation performance as compared with $SiO_2$ layer formed by using a CVD method or a thermal oxidation method.

Accordingly, employment of a CVD method or a thermal oxidation method and employment of a sputtering method cause a problem of oxidation of metal ultrafine particles and a problem of low insulation performance of an insulator, respectively. As a result, there occurs such a problem that high charge retention performance of the metal ultrafine particle floating gate can not be sufficiently exhibited or that thin film of insulator can not be sufficiently achieved, and element performance of nonvolatile semiconductor memory element having a metal fine particle floating gate has not been sufficiently exhibited.

The present invention has been made to solve these problems, and the present invention provides a nonvolatile semiconductor memory element capable of improving insulation performance of an insulator surrounding a floating gate composed of e.g. metal fine particles, and capable of decreasing the ratio of oxidized metal portion in the floating gate, and the present invention provides a process for producing such an element.

Means of Solving the Problem

Considering the above points, a first aspect of the present invention provides a process for producing a nonvolatile semiconductor memory element having a mixed or laminated structure of:

a hardly oxidizable material composed of a hardly oxidizable element having a Gibbs' formation free energy for forming oxide higher than the Gibbs' formation free energy of Si for forming oxide under the same temperature condition at 1 atm and in a temperature range of from 0° C. to 1,200° C.: and an oxide of an easily oxidizable material composed of an element having a Gibbs' formation free energy for forming oxide lower than the Gibbs' formation free energy of Si for forming oxide under the same temperature condition at 1 atm in the temperature range of from 0° C. to 1,200° C., and Si;

the process comprising;

a step of forming a portion made of a hardly oxidizable material and a portion made of the oxide of the easily oxidizable material by a physical forming method; and a step of carrying out a heat treatment in a mixed gas of an oxidizing gas functioning as an oxidizing agent and a reducing gas functioning as a reducing agent, wherein the mixture ratio of the oxidizing gas and the reducing gas and the temperature are controlled so that the hardly oxidizable material is reduced and the oxide of the easily oxidizable material is oxidized in a temperature range of from 0° C. to 1,200° C.

By this construction, in a nonvolatile semiconductor memory element having a construction that a hardly oxidizable material composed of e.g. W, Ni or Co is used as an ultrafine particle floating gate or a single floating gate and that an oxide of easily oxidizable material such as $SiO_2$ is used as an insulator surrounding the floating gate, wherein the ultrafine particle floating gate or the single floating gate and the insulator are formed by using a physical forming method, it is possible to bond oxygen atoms to oxygen-shortage type defects or free valencies etc. in an insulator such as $SiO_2$ while the ultrafine particle floating gate or the single floating gate is not oxidized or while it is reduced, whereby it is possible to improve insulating performance of the insulator surrounding the floating gate such as the metal ultrafine particle floating gate and to decrease the ratio of oxidized metal ultrafine particles in the floating gate as compared with conventional elements, whereby it is possible to realize a process for producing nonvolatile semiconductor memory element having high charge retention performance. Here, "hardly oxidizable" in the present invention means a property that a material is more hardly oxidizable than Si, and specifically, a property that a Gibbs' formation free energy for forming oxide of the material is higher than an oxide-formation free energy of Si in an environment of 1 atm and the same temperature, is defined as a property of more hardly oxidizable than Si. Further, an element having such a property is defined as a hardly oxidizable element, and a material composed of a hardly oxidizable element is defined as a hardly oxidizable material. On the other hand, "easily oxidizable" in the present invention means a property that a material is more easily oxidizable than Si, and specifically, a property that Gibbs' formation free energy for forming oxide of the material is equal or lower than an oxide-formation free energy of Si in an environment of 1 atm and the same temperature, is defined as a property of more easily oxidizable than Si. Further, in the same manner as the case of the above hardly oxidizable property, easily oxidizable element and easily oxidizable material are defined correspondingly.

Further, a second aspect of the present invention provides a process for producing a nonvolatile semiconductor memory element having a mixed or laminated structure of:

a hardly oxidizable material composed of a hardly oxidizable element having a Gibbs' formation free energy for forming oxide higher than the Gibbs' formation free energy of Si for forming oxide under the same temperature condition at 1 atm and in a temperature range of from 0° C. to 1,200° C.; and an oxide of an easily oxidizable material composed of an element having a Gibbs' formation free energy for forming oxide lower than the Gibbs' formation free energy of Si for forming oxide under the same temperature condition at 1 atm in the temperature range of from 0° C. to 1,200° C., and Si;

the process comprising;

a step of forming a portion made of the hardly oxidizable material by a physical forming method and forming a portion made of the oxide of the easily oxidizable material by a chemical forming method; and a step of carrying out a heat treatment in a mixed gas of an oxidizing gas functioning as an oxidizing agent and a reducing gas functioning as a reducing agent, wherein the mixture ratio of the oxidizing gas and the reducing gas and the temperature are controlled so that the hardly oxidizable material is reduced and the oxide of the easily oxidizable material is oxidized in a temperature range of from 0° C. to 1,200° C.

By this construction, in a nonvolatile semiconductor memory element having a construction that a hardly oxidizable material composed of e.g. W, Ni or Co is used as an ultrafine particle floating gate or a single floating gate and using an oxide of easily oxidizable material such as $SiO_2$ is used as an insulator surrounding the floating gate, wherein the ultrafine particle floating gate or the single floating gate is formed by using a physical forming method and the insulator is formed by using a chemical forming method, it is possible to bond oxygen atoms to oxygen-shortage type defects or free valencies in an insulator such as $SiO_2$ by reducing the ultrafine particle floating gate or the single floating gate without oxidizing them, whereby it is possible to improve insulating performance of the insulator surrounding a floating gate such as the metal ultrafine particle floating gate and to decrease the ratio of oxidized metal ultrafine particles in the floating gate as compared with conventional elements, whereby it is possible to realize a process for producing nonvolatile semiconductor memory element having high charge retention performance.

Further, a third aspect of the present invention provides a process for producing a nonvolatile semiconductor memory element having a mixed or laminated structure of:

a hardly oxidizable material composed of a hardly oxidizable element having a Gibbs' formation free energy for forming oxide higher than the Gibbs' formation free energy of Si for forming oxide under the same temperature condition at 1 atm and in a temperature range of from 0° C. to 1,200° C.: and an oxide of an easily oxidizable material composed of an element having a Gibbs' formation free energy for forming oxide lower than the Gibbs' formation free energy of Si for forming oxide under the same temperature condition at 1 atm in the temperature range of from 0° C. to 1,200° C., and Si;

the process comprising:

a step of forming a portion made of a hardly oxidizable material by forming a tentative forming layer in which the hardly oxidizable material and a first oxide of the easily oxidizable material are mixed or laminated, by a physical forming method, followed by selectively removing the first oxide of the easily oxidizable material in the tentative forming layer;

a step of forming a portion made of the oxide of the easily oxidizable material by depositing a second oxide of the easily oxidizable material that is the same or different from the first oxide of the easily oxidizable material, by using a physical forming method or a chemical forming method after the first oxide of the easily oxidizable material in the tentative forming layer is selectively removed; and a step of carrying out a heat treatment in a mixed gas of an oxidizing gas functioning as an oxidizing agent and a reducing gas functioning as a reducing agent, wherein the mixture ratio of the oxidizing gas and the reducing gas and the temperature are controlled so that the hardly oxidizable material is reduced and the second oxide of the easily oxidizable material is oxidized in a temperature range of from 0° C. to 1,200° C.

By this construction, in a nonvolatile semiconductor memory element having a construction that a hardly oxidizable material composed of e.g. W, Ni or Co is used as an ultrafine particle floating gate or a single floating gate and an oxide of an easily oxidizable material such as $SiO_2$ is used as an insulator surrounding the floating gate, wherein the ultrafine particle floating gate or the single floating gate is formed by using a physical forming method and the insulator is formed by using a physical forming method or a chemical forming method, it is possible to bond oxygen atoms to oxygen-shortage type defects or free valencies in an insulator such as $SiO_2$ while the ultrafine particle floating gate or the single floating gate is not oxidized or while it is reduced, whereby it is possible to improve insulating performance of the insulator surrounding the floating gate such as the metal ultrafine particle floating gate and to decrease the ratio of oxidized metal ultrafine particles in the floating gate, whereby it is possible to realize a process for producing nonvolatile semiconductor memory element having high charge retention performance. Further, since the first oxide such as $SiO_2$ of the easily oxidizable material containing relatively large amount of oxygen-shortage type defects in the tentative forming layer formed by using a physical forming method, is selectively removed, and the second oxide of the easily oxidizable material having little oxygen-shortage type defects, is subsequently deposited, it is possible to realize a process for producing nonvolatile semiconductor memory element having an insulator containing further little oxygen-shortage type defects.

Further, a fourth aspect of the present invention provides the process for producing a nonvolatile semiconductor memory element, wherein change amount of Gibbs' free energy of the oxidizing gas required for oxidation reaction with the easily oxidizable material is negative in the temperature range of from 0° C. to 1,200° C., change amount of Gibbs' free energy of the reducing gas required for reduction reaction with the oxide of the hardly oxidizable material is negative in the temperature range of from 0° C. to 1,200° C., and change amount of Gibbs' free energy of the reducing gas required for reduction reaction with the oxide of the easily oxidizable material is positive in the temperature range.

By this construction, besides the effect of any one of the first to third aspects, in a range of from 0° C. to 1,200° C., the oxidizing gas can appropriately oxidizes an easily oxidizable material such as Si without oxidizing, the ultrafine particle floating gate or the single floating gate, and the reducing gas can appropriately reduce the ultrafine particle floating gate or the single floating gate without reducing the oxide such as $SiO_2$ of an easily oxidizable material. Accordingly, it is possible to regulate the oxidation power of the oxidizing gas used and reduction power of the reducing gas used, it is possible to properly perform the heat treatment for oxidation and reduction, and to realize a process for producing nonvolatile semiconductor memory element having high charge retention performance.

Further, a fifth aspect of the present invention provides the process for producing a nonvolatile semiconductor memory element according to any one of the first to fourth aspects, wherein the oxidizing gas contains $H_2O$ and the reducing gas contains $H_2$.

By this construction, besides the effect of any one of the above first to fourth aspects, since hydrogen and water vapor are widely used in the field of semiconductor element manufacturing and easy to handle, are used in the mixed gas, it is possible to realize a process capable of producing easily, safely and with good reproducibility a nonvolatile semiconductor memory element having high charge retention performance.

Further, a sixth aspect of the present invention provides the process for producing a nonvolatile semiconductor memory element excellent in charge retention characteristics according to any one of the first to fifth aspects, wherein the heat treatment is carried out in a mixed gas of the oxidizing gas and the reducing gas so that the hardly oxidizable material is reduced and the oxide of the easily oxidizable material is oxidized, and subsequently, a further heat treatment is carried out in a predetermined inert gas atmosphere or is under a reduced pressure.

By this construction, besides the effect of any one of the above first to fifth aspects, since a further heat treatment is carried out in a predetermined inert gas atmosphere or under a reduced pressure after the oxidation reduction treatment is performed, it is possible to realize a process for producing nonvolatile semiconductor memory element capable of effectively removing by-product material such as OH groups which may remain after the oxidation reduction treatment. Here, OH groups that may remain after the oxidation reduction treatment, may cause adverse affects such that it decreases melting point of the oxide or decreases insulation performance of the oxide.

Further, a seventh aspect of the present invention provides a nonvolatile semiconductor memory element having the hardly oxidizable material, and produced by using the process for producing nonvolatile semiconductor memory element as defined in any one of the above first to sixth aspects.

By this construction, it is possible to realize a nonvolatile semiconductor memory element providing an effect of any one of the above first to sixth aspects.

EFFECTS OF THE INVENTION

According to the present invention, in a nonvolatile semiconductor memory element having a construction that a hardly oxidizable material composed of e.g. W, Ni or Co is used as an ultrafine particle floating gate or a single floating gate and an oxide such as $SiO_2$ of an easily oxidizable material is used as an insulator encompassing the floating gate, wherein the ultrafine particle floating gate or a single floating gate is formed by using a physical forming method and the insulator is formed by using a physical forming method or a chemical forming method, it is possible to bond oxygen atoms with oxygen-shortage type defects or free valencies in an insulator such as $SiO_2$ while the ultrafine particle floating gate or the single floating gate is not oxidized or while it is reduced, whereby it is possible to improve insulation performance of the insulator surrounding the floating gate such as the metal ultrafine particle floating gate, and to decrease the ratio of oxidized metal ultrafine particles in the floating gate, whereby it is possible to provide a nonvolatile semiconductor memory element having high charge retention performance and a process for producing such a nonvolatile semiconductor memory element.

EXPLANATION OF NUMERALS

1: Semiconductor substrate,
2: element isolation,
3, 23, 33: tunnel insulation film,
4, 24, 34: charge retention layer,
4a1, 24a1, 34a1: ultrafine particles,
4b: matrix insulator,
4c, 5b, 34c: oxygen shortage type defect,
4d, 5c, 34d: free valency
4e, 5d: OH group,
5, 5a, 25, 35: gate insulation film,
6: control gate,
7: source region,
7a, 8a: shallow junction region,
7b, 8b: contact region,
8: drain region,
9: sidewall,
10: halo ion implantation region,
21: screen oxide film,
24f: oxidized portion,
34b: $SiO_2$ matrix insulator,
100, 200, 300: nonvolatile semiconductor memory element

BEST MODE FOR CARRYING OUT THE INVENTION

From now, embodiments of the present invention will be described with reference to drawings.

Embodiment

Figure 1:
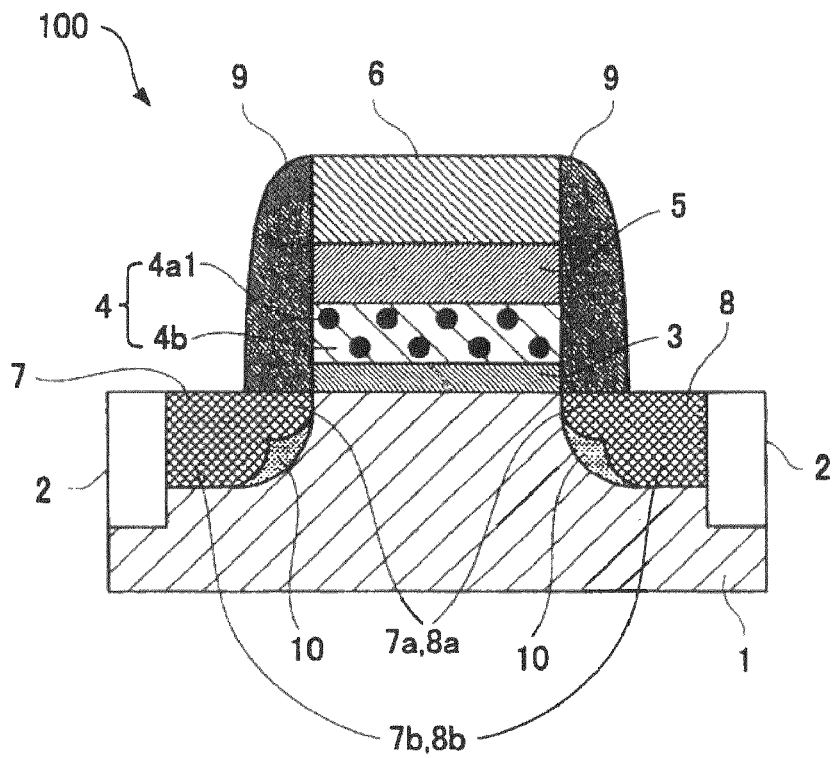
FIG. 1: An explanation view schematically shoring an example of a cross sectional structure of nonvolatile semiconductor memory element according to an embodiment of the present invention.

FIG. 1 is an explanation view schematically showing an example of cross sectional structure of a nonvolatile semiconductor memory element according to an embodiment of the present invention. In FIG. 1, a nonvolatile semiconductor memory element 100 is formed on a semiconductor substrate 1, and is isolated by element isolation 2. Here, the semiconductor substrate 1 in FIG. 1 is a semiconductor substrate of p-type, and the element isolation 2 is one formed by using a STI (Shallow Trench Isolation) technique.

The nonvolatile semiconductor memory element 100 has a structure that on the semiconductor substrate 1, a tunnel insulation film 3, a charge retention layer 4 for retaining an electric charge, a gate insulation film 5 and a control gate 6 laminated in this order. The charge retention layer 4 has a structure that ultrafine particles 4a1 functioning as a floating gate is dispersed in a matrix insulator 4b with high density.

Here, the control gate 6 forms a channel on a surface of the semiconductor substrate 1 according to an applied voltage and injects or releases an electric charge to/from the charge retention layer 4. On the surface of the semiconductor substrate 1, a source region 7 and a drain region 8 are formed. The source region 7 and the drain region 8 are regions doped with n-type impurities, and have contact regions 7b, 8b for obtaining an ohmic contact with an Al circuit, and shallow junction regions 7a, 8a containing relatively low concentration of n-type impurities for serving to realize high withstand voltage of diffusion layer and to suppresses excess generation of hot carriers.

The above source region 7 and drain region 8 are each formed so that its region (gate overlap region) overlapped with a region where the charge retention layer 4 and the control gate 6 are formed, is minimized by using a technique of so-called self alignment. This construction is for the purpose of reducing parasitic capacitance formed by the overlap. Further, in a case of element having a gate length of about 0.3 μm or smaller, it is preferred to form halo ion implantation regions 10 in the semiconductor substrate 1 in regions more inside from the shallow junction regions 7a, 8a, by ion-implanting p-type impurities having the same polarity as that of the semiconductor substrate 1 so that the concentration of p-type impurities is increased. This halo ion implantation exhibits an effect of decreasing leakage between the source and the drain occurred at a portion slightly deeper than the vicinity of semiconductor surface where a channel is formed when the gate length is short.

As the semiconductor substrate 1, a single crystal substrate of Si or Ge, a single crystal substrate of SiGe, a single crystal substrate of SiC, or a SOI (silicon on insulator) substrate having a structure that a layer of any of these single crystals is formed on an insulator, may be employed. A single crystal substrate of Si is preferred for the reason that its physical properties are identified, and it is easily available. As a material of semiconductor substrate (or layer) for contributing high speed operation of element, a single crystal of e.g. Ge or SiGe or a single crystal of Si having a strain from the viewpoint that they improve carrier mobility. Further, from the viewpoint of decreasing delay time by decreasing parasitic capacitance of substrate depletion layer, or for improving subthreshold properties, a SOI substrate is preferred. Further, for operation under high temperature environment or a high voltage drive, e.g. a single crystal substrate of SiC is preferred.

Here, for the reason that electrons having higher mobility than holes can be used as carriers, the above semiconductor substrate is preferably a p-type semiconductor.

From now, explanation will be made under assumption that the semiconductor substrate 1 is a single crystal substrate of Si. In the above, the element isolation is a STI type element isolation, but when high integration density is not required, a so-called LOCOS (local oxidation of silicon) type element isolation may also employed.

The tunnel insulation film 3 may be formed by using an oxide film such as a $SiO_2$ film, a nitride film or any of other insulative materials, and among these, a $SiO_2$ film is preferred for achieving good element operation since dense and stable $SiO_2$ film can be obtained by subjecting Si to thermal oxidation. Further, as a tunnel insulation film 3, a high dielectric film made of a high dielectric material (high-k material) such as $SiO_xN_y$ or a Hf type oxide, is preferred for the following reasons.

Namely, by employing a dielectric film made of a is high dielectric material, it is possible to increase capacitive coupling property between the semiconductor substrate 1 and the control gate 6 to suppress short-channel effect, and it is possible to suppress diffusion of metal elements from a floating gate to the semiconductor substrate 1 when the metal is employed for the floating gate in the charge retention layer 4 on the tunnel insulation film 3. Here, the above x and y satisfies $0 \leq x<2$ and $0<y \leq 4/3$. Here, it is preferred that the x and y further satisfy a condition $2x+3y=4$ at the same time for reducing free valencies.

The charge retention layer 4 is formed on the tunnel insulation film 3 and has ultrafine particles 4a1 for retaining an electric charge and a matrix insulator 4b in which the ultrafine particles 4a1 are dispersed. Various methods for forming the charge retention layer 4 have been developed, and as described in e.g. JP-A-2004-55969, a method (hereinafter referred to as simultaneous sputtering method) of simultaneously sputtering using both a target for ultrafine particles 4a1 made of a material having a large work function and a target for the matrix insulator 4b, is preferred for the following reasons.

By using the above forming method of charge retention layer, a film having a structure that metal ultrafine particles 4a1 is highly densely dispersed in the matrix insulator 4b, is obtained. By employing a charge retention layer 4 in which ultrafine particles 4a1 of a metal having a large work function are highly densely dispersed, the following merits are obtained. Namely, since the material of ultrafine particles forming a floating gate is a metal having a large work function, it is possible to retain electric charge at a deeper energy level as compared with a semiconductor, which increases a potential barrier at an interface with an insulator. As a result, it is possible to increase a potential barrier of the tunnel insulation film 3, it is possible to suppress loss of electric charge from the ultrafine particles by tunnel-leakage, and it is possible to increase charge retention performance.

Further, since a large number of metal ultrafine particles forming a floating gate are present in a memory element with high density and the particles are insulated one another by a matrix insulator, even when e.g. insulation breakage occurs in the tunnel insulation film, the amount of lost electric charge can be limited to a narrow area and minimum amount. Thus, division of floating gate provides an effect of tolerating occurrence of insulation breakage to a certain extent, which contributes to improve yield of the element.

The more number of floating gates are contained in an element, the higher the above effect can be increased, and this can be achieved by forming ultrafine particles at a high density. The size of each ultrafine particle is preferably as small as possible. Here, since it is possible to disperse a large number of extremely small metal ultrafine particles of a diameter of about 1 to 3 nm, densely in a matrix insulator by employing the above simultaneous sputtering method, the method for forming ultrafine particles is extremely suitable from the viewpoint of the above charge retention performance and insulation breakage, etc.

The reason why it is possible to disperse the ultrafine particles in a small size at high density by using the above simultaneous sputtering method, is that since the metal ultrafine particles and the matrix insulator are formed simultaneously, the matrix insulator covers around each of the metal ultrafine particles when the ultrafine particles are formed, and the matrix insulator functions to suppress particle growth of the metal ultrafine particles. Further, under the growth conditions in which migration is sufficiently allowed, metal fine particles on a substrate generally grow to a predetermined size determined by thermodynamics. However, in a sputtering method, since metal fine particles are formed at a relatively low temperature, it becomes possible to stop the reaction for particle growth in a non-equilibrium state before the particles grows to the thermodynamically determined size. For these reasons, as the method for forming charge retention layer, the simultaneous sputtering method using a metal target and an insulator target, is extremely preferred.

Further, a metal for forming the metal ultrafine particles preferably has a work function of not only large but also close to the work functions of the semiconductor substrate and the control gate, for the purpose of increasing charge retention performance. Here, the work function of semiconductor substrate means an energy difference between its Fermi level and vacuum level. Specifically, it is preferred that the metal has a work function of at least 4.2 eV and the difference from the work function of semiconductor substrate or control gate is at most 0.5 eV.

Further, the metal to be used for forming the metal ultrafine particles preferably has a high melting point and made of an element whose ionizing energy in a semiconductor is sufficiently smaller than a half of energy band (hereinafter referred to as gap energy) in a band gap of the semiconductor, for the reasons that a high melting point metal is stable in a high temperature environment in the semiconductor manufacturing process and that when the metal is diffused through the tunnel insulation film to reach the semiconductor substrate, the metal does not affect generation and recoupling of electron and hole in the channel.

Specifically, the metal preferably has a melting point of at least 1,400° C. and its ionizing energy is preferably at least 0.1 eV smaller than a half of the gap energy. By putting together the viewpoints of work function, melting point and ionizing energy, the metal for forming metal ultrafine particles is specifically preferably W, Mo, Ti, Pd, Ni, Ta, Cr or the like, but it may be Os, $R_e$, Nb, Ru, Rh or Pt as well.

Further, in order to obtain insulation between adjacent metal ultrafine particles, the distance between metal ultrafine particles is preferably larger than the predetermined distance, and it is specifically preferably at least 1 nm. Further, when the distance is too large, high density of the ultrafine particles is hard to obtain, and accordingly, the distance is preferably at most 5 nm. The distance between adjacent metal ultrafine particles substantially depends on the mixture ratio of the metal and the insulator in a target used for sputtering, and the distance between adjacent metal ultrafine particles can be controlled by adjusting the mixture ratio. Here, the distance between ultrafine particles in this explanation means the shortest distance from an interface between an ultrafine particle and the matrix insulator to an interface between another ultrafine particle and the matrix insulator when these two ultrafine particles are adjacent to each other.

Meanwhile, the matrix insulator 4b is preferably a material having low electron affirmity which easily becomes amorphous, for the purpose of increasing charge retention performance. Further, the matrix insulator 4b preferably has a high melting point for the reason that such a matrix insulator 4b is stable in a high temperature environment in the semiconductor manufacturing process. Specifically, the electron affirmity is preferably at most 1.0 eV, and the melting point is preferably at least 1,400° C. By putting together the viewpoints of electron affirmity, easiness of forming amorphous and the melting point, the matrix insulator 4b is preferably an amorphous material made of e.g. $SiO_2$. As an alternative, an amorphous $Al_2O_3$ or $TiO_2$ may also be employed.

However, when e.g. an oxide is employed as the matrix insulator 4b of the charge retention layer 4, an oxide usually contains a large number of defects due to shortage of oxygen such as oxygen shortage type defects or free valencies (hereinafter simply referred to as defects due to oxygen shortage; the corresponding definition is applied also to defects such as shortage type defects or free valencies in an insulator such as a nitride other than oxide), there is the following problem.

Namely, an electric charge retained in an ultrafine particle easily moves to adjacent another ultrafine particle via such a defect due to oxygen shortage, to cause deterioration of insulation between ultrafine particles.

In order to avoid such deterioration of insulation, it is necessary to bond oxygen atoms to a large number of defects due to oxygen shortage such as oxygen shortage type defects or free valencies contained in the matrix insulator of the charge retention layer, to remove these defects due to oxygen shortage. Here, removal of these defects due to oxygen shortage needs to be carried out so as not to oxidize ultrafine particles. A specific method to suppress oxidization of ultrafine particles and at the same time to bond oxygen atoms to defects of the oxide, will be described later.

The method for forming the gate insulation film 5 formed on the charge retention layer 4 are roughly categorized into physical forming methods and chemical forming methods, and any one of these methods may be used for forming the gate insulation film 5, but these methods each has a merit and demerit. First of all, in a physical forming method such as a sputtering method, since the film-forming temperature is relatively low, there is a merit that oxidation of a floating gate 4a1 in the underlying charge retention layer 4 can be suppressed. However, since a gate insulation film formed by this method contains many defects due to oxygen shortage, its insulation performance is generally low.

Accordingly, in a case of forming the gate insulation film 5 by a physical forming method, an effect of suppressing ultrafine particles 4a1 present in the underlying charge retention layer 4, is high, but insulation performance of the gate insulation film 5 itself becomes low. As a result, the possibility that an electric charge accumulated in the ultrafine particles 4a1 leak through a large number of defective levels present in the gate insulation film 5 into the control gate 6, increases, and the charge retention performance of the element decreases.

On the other hand, in a chemical forming method that is more widely used for forming an insulator than a physical forming method, the density of defects due to oxygen shortage in an insulator formed, is low, and its insulation performance is generally higher than that obtained by a physical forming method. However, in a chemical forming method, the film-forming temperature is generally high, and there is a demerit that the ultrafine particles 4a1 in the underlying charge retention layer 4 tend to be oxidized at a time of film-forming. Accordingly, in a case of forming the gate insulation film 5 by a chemical forming method, the insulation performance of the gate insulation film 5 itself is high, but the ultrafine particles 4a1 contained in the underlying charge retention layer 4 tend to be oxidized. Namely, a situation opposite to that in a case of using a physical forming method, is realized. When the floating gate 4a1 is oxidized, an energy level for retaining electric charge increases, and as a result, a potential barrier decreases and the charge retention performance decreases.

As described above, two types of methods considerable as methods for forming the gate insulation film 5, namely, a physical forming method and a chemical forming method, each has a problem not desirable from the viewpoint of charge retention performance of an element. Problems to be solved in these two forming methods of the gate insulation film 5, are to decrease defects due to oxygen shortage in the gate insulation film 5 in the case of physical forming method, and to decrease oxidation of ultrafine particles 4a1 present in the underlying charge retention layer 4 in the case of chemical forming method.

Now, an oxidation reduction treatment method according to the present invention which solves the above-mentioned problems, will be described using as an example of a construction that the charge retention layer 4 comprises metal ultrafine particles and a matrix insulator made of an oxide, and that the gate insulation film 5 is an oxide formed by using a physical forming method. Here, the tunnel insulation film 3 is assumed to be an oxide.

An oxidizing agent for removing defects due to oxygen shortage in the oxide, and a reducing agent for reducing the oxidized metal ultrafine particles, are assumed to satisfy the following standards. First of all, the oxidizing agent has to be a material having sufficient oxidizing power for oxidizing an easily oxidizable material such as Si, but not oxidizing a hardly oxidizable material such as Ni or W. Meanwhile, the reducing agent has to be a material satisfying a condition that it can reduce a hardly oxidizable material such as Ni or W but it does not reduce an easily oxidizable material. Here, hardly oxidizable and easily oxidizable are terms defined by using a formation free energy for forming an oxide as described above.

As an oxide satisfying the above conditions, $H_2O$, $NO_2$, $N_2O_4$, NO, $N_2O$, $SO_2$, $SO_3$, $CO_2$, CO or HClO may, for example, be used for oxidizing Si. Further, as a reducing agent satisfying the above conditions, $H_2$, $NH_3$, $N_2H_4$, $N_2H_2$, CO or $CH_4$ may, for example, be used. Especially, using $H_2O$ as an oxidizing agent and using $H_2$ as a reducing agent is the most excellent for such reasons that influence of residual by-product is relatively small, they are extremely widely used in a conventional semiconductor manufacturing process, there are many academic and technical knowledges already obtained for these gases, and that handling of these gases is relatively easy.

Here, e.g. $O_2$ or $O_3$ may be used as an oxidizing agent, but there occurs production problems such that these materials have extremely strong oxidizing power and they oxidize metal ultrafine particles that are supposed to be reduced, whereby the equilibrium condition at which reduction reaction becomes dominant moves to a high temperature side. In a case of using these strongly oxidizing agent for oxidizing defects due to oxygen shortage in an oxide, it is preferred to use e.g. $H_2$ having high reactivity with the above e.g. $O_2$ or $O_3$, as a reducing agent, so that they sufficiently react to produce e.g. $H_2O$ gas before they are introduced as treatment atmosphere, and use the produced reacted product as an oxidizing agent.

Next to $H_2O$ and $H_2$, a nitrogen type compound is preferred as an oxidizing agent. Here, in this case, it is necessary to note generation of nitrogen compound as a by-product, and it is necessary to appropriately remove such a nitrogen compound. On the other hand, a carbon type compound or a sulfur type compound are not preferred since solid by-product such as graphite, a carbon compound or a sulfur compound tends to be precipitated and removal of these by-products becomes necessary. From now, for convenience of explanation, it is assumed that $H_2O$ is used as an oxidizing agent, $H_2$ is used as a reducing agent and each of the above oxides is $SiO_2$.

Figure 2:
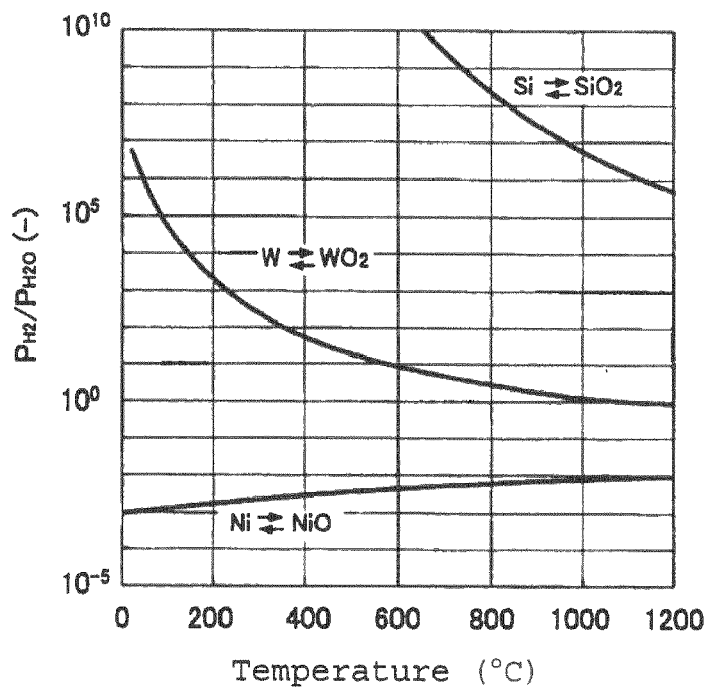
FIG. 2: A view explaining an oxidation-reduction conditions in a construction that ultrafine particles are made of W or Ni and matrix insulator is made of $SiO_2$.

FIG. 2 is a view for illustrating oxidation reduction conditions in a construction that ultrafine particles are made of W or Ni and a matrix insulator is made of $SiO_2$. In the oxidation method of the matrix insulator and the reduction method of ultrafine particles according to the embodiment of the present invention, a mixed gas of $H_2O$ gas and $H_2$ is used as an atmospheric gas. In FIG. 2, the vertical axis represents a partial pressure ratio (hereinafter referred to as $H_2$ partial pressure ratio to $H_2O$) of $H_2$ based on $H_2O$, the lateral axis represents a temperature (° C.). Each of the curves shown in FIG. 2 is calculated under the condition that each of $H_2$ and $H_2O$ is an ideal gas having a fugacity coefficient of 1.

In the calculation of curves shown in FIG. 2, a saturated vapor pressure of $H_2O$ is used as a partial pressure of $H_2O$ in a temperature range of less than 100° C. Further, the curve described as "Si" indicates that Si is reduced by an atmospheric gas in a region above the curve and Si is oxidized by an atmospheric gas in a region below the curve. The curves described as "W" and "Ni" respectively, indicate the same manner.

In the treatment for removing defects due to oxygen shortage, at a temperature lower than a predetermined temperature, the reaction speed is low and the treatment time becomes long. On the other hand, at a temperature higher than the predetermined temperature, agglomeration of metal fine particles starts to occur or the metal and the insulator form a new compound at their interfaces, such being not preferred. Further, it is also not preferred that the matrix insulator, the gate insulation film and the tunnel insulation film are partially crystallized by the high temperature treatment.

When electric charge retained in an ultrafine particle moves through an insulator by tunnel conduction, and when the insulator is amorphous, a material wave of electric charge tends to be scattered since the lattice arrangement of the insulator is irregular, whereby the movement of electric charge to adjacent ultrafine particles, the control gate and the semiconductor substrate by the tunnel conduction, is suppressed. On the other hand, when the insulator is crystalline, since its lattice is regularly arranged, the material wave of electric charge is hard to be scattered, the movement by the tunnel conduction becomes relatively easier than the case of amorphous. This state is not preferred considering the characteristics required for the charge retention layer, and the gate insulation film and the tunnel insulation film. From these reasons, the oxidation reduction treatment in the present invention is preferably carried out in a temperature range of from about 600° C. to 900° C., and more preferably in a range of from 700° C. to 800° C.

Further, in an actual oxidation reduction treatment, a sample experiences a temperature history that the sample in a state of room temperature is moved into an oxidation reduction treatment furnace, subjected to an oxidation reduction treatment at a predetermined temperature, and thereafter, moved to the outside of the oxidation reduction treatment where the temperature is a room temperature. However, during the oxidation reduction treatment, it is necessary to satisfy the oxidation reduction conditions in the entire temperature range that the sample wafer experiences. Considering this point, control of partial pressure ratio of the atmospheric gas is important.

For example, when the ultrafine particles are made of W, when the treatment is carried out at a treatment temperature of 750° C., the $H_2$ partial pressure ratio to $H_2O$ may be within a range of from $10^1$ to $10^8$ from FIG. 2. However, at a temperature lower than this range, at a time of e.g. moving the sample into or out from the oxidation reduction treatment furnace, the partial pressure ratio of $H_2$ to $H_2O$ needs to be increased, for example, to about $10^7$ or higher at a room temperature to avoid oxidation of W. Accordingly, at a time of moving the sample into or out from the oxidation reduction treatment furnace, it is necessary to sufficiently decrease the $H_2O$ gas partial pressure in the treatment furnace, and for this purpose, it is necessary to stop supply of $H_2O$ gas and sufficiently discharge the gas to the outside of the furnace.

At this time, by once evacuating the inside of the oxidation reduction furnace to a pressure of about $10^{-2}$ Pa or lower, followed by introducing $H_2$ gas, it is possible to securely discharge H₂O gas, such being more preferred. Meanwhile, when the ultrafine particles are made of Ni, the lower limit value of the $H_2$ partial pressure ratio to $H_2O$ remarkably decreases to about $10^{-2}$, and the temperature range meeting the oxidation reduction treatment according to the present invention, is wide. Further, when a plurality of types of metals are employed in a sample, it is preferred to accommodate the treatment condition to the condition of metal material having the narrowest conforming condition range.

By appropriately carrying out the oxidation reduction treatment, it is possible to avoid oxidation of the metal ultrafine particles or reduce the oxidized portion, and at the same time bonding oxygen atoms with oxygen shortage type defects or free valencies of the oxide adjacent to the metal ultrafine particles. As a result, it becomes possible to improve charge retention performance of a nonvolatile semiconductor memory element using metal ultrafine particles as a floating gate. However, there is a case where as a side effect of the above oxidation reduction treatment method, hydrogen atoms enter into an atomic bonding network of the oxide, and bond with oxygen atoms to form OH groups to cut or terminate the bonding network.

Since the OH groups may adversely affect e.g. the melting point and the insulation performance of the oxide, it becomes necessary to remove the OH groups formed by carrying out the above oxidation reduction treatment. For this reason, after the above oxidation reduction treatment, it is necessary to continuously carry out annealing (hereinafter referred to as inert atmosphere annealing) in an inert atmosphere or a reduced-pressure atmosphere, to discharge hydrogen atoms bonded with oxygen atoms and forming OH groups to the outside of the film.

In an inert atmosphere annealing for the purpose of removing OH groups, it is necessary to provide a thermal energy sufficient for cutting OH bonds to let the hydrogen atoms free, and to quickly discharge the generated $H_2$ to the outside of the system, and it is necessary to avoid oxidation reaction of metal ultrafine particles and reduction reaction of the oxide. For this purpose, the inert atmosphere annealing for the purpose of removing OH groups, is preferably carried out in an inert gas or in a reduced-pressure atmosphere. Here, the inert gas or reduced-pressure atmosphere, should be controlled and maintained also at times of moving a sample into and out from the oxidation reduction treatment furnace.

In order to provide sufficient thermal energy to cut OH bonds, it is preferred to set the treatment temperature to be at least 600° C. On the other hand, when the temperature is too high, agglomeration of metal ultrafine particles becomes to occur, or the metal and the insulator forms a new compound at their interfaces, such being not preferred. Further, at a high temperature, the matrix insulator, the gate insulation film and the tunnel insulation film are partially crystallized, such also being not preferred.

When electric charge retained in an ultrafine particle moves through the insulator by tunnel conduction, and when the insulator is amorphous, since the lattice arrangement of the insulator is irregular, the material wave of the electric charge tends to be scattered, and movement of the electric charge to adjacent ultrafine particles, the control gate or the semiconductor substrate by the tunnel conduction, is suppressed. On the other hand, when the insulator is crystalline, since the lattice is regularly arranged, the material wave of the electric charge is hard to be scattered, and movement of the electric charge by tunnel conduction becomes relatively easier than the case of amorphous. This state is not preferred considering the properties required for the charge retention layer, the gate insulation film and the tunnel insulation film.

For the above reasons, the treatment temperature is preferably from about 600° C. to 900° C., more preferably from 700° C. to 800° C.

The oxidation reduction treatment and the inert atmosphere annealing in an inert gas atmosphere or a reduced-pressure atmosphere, may be carried out in any step on and after forming of the charge retention layer, and it can be carried out an optional number of times. However, the oxidation reduction treatment and the inert atmosphere annealing are treatments mainly effective for the charge retention layer, the gate insulation film and the tunnel insulation film, and accordingly, it is the most preferably carried out after forming of the gate insulation film.

In a case of carrying out the oxidation reduction treatment after depositing another film after forming the charge retention layer 4 and the gate insulation film 5, it is necessary that the reaction material is diffused in the deposited film and reaches the charge retention layer 4 and the gate insulation film 5. In the same manner, in order to discharge reaction product to the outside of the system, it is necessary that the reaction product is diffused through the deposited film to move to the surface of the sample. Since such diffusion takes a long time, it is not preferred to carry out the treatment in a state that the above another film is thickly deposited.

However, in order to repair deteriorated portions of the charge retention layer 4 and the gate insulation film 5, or in order to repair a deteriorated portions of the control gate 6, that are caused by a plasma damage at a time of gate fabrication or other reactions, it is extremely effective to carry out the treatment again after the gate fabrication. Further, when side walls 9 are formed on gate sidefaces after the gate fabrication, and when the forming of the sidewalls is carried out, for example, by a CVD method, the ultrafine particles may be oxidized in the step of depositing the sidewall films. Also in this case, it is preferred to carry out the above oxidation reduction treatment and the inert atmosphere annealing again after the forming of sidewalls.

The control gate 6 may be made of any one of a polycrystal Si containing impurities, a metal Si compound, a metal or a complex material as a combination of a plurality of materials such as a lamination of the above materials. In order to improve writing and erasing operation speeds, the resistance of the control gate is preferably low, and the control gate preferably has a sheet resistance of at most 5 $\Omega$/sq, more preferably at most 1 $\Omega$/sq. In a case of using a polycrystal Si for the control gate, when the control gate is applied to a nMOSFET, a n-type impurity is usually contained in the polycrystal Si, and on the other hand, when the control gate is applied to a pMOSFET, a p-type impurity is usually contained in the polycrystal Si.

A source region 7 and a drain region 8 preferably have shallow junction regions 7a, 8a respectively to make slopes of impurity concentrations in the vicinities of connection regions of the regions 7, 8 with the channel, to thereby weaken electric field intensity in the lateral direction (a direction in parallel with semiconductor surface) in order to suppress generation of excessive hot carriers. In these shallow junction regions 7a, 8a, the impurity concentrations are lower and the junction depths are shallower than those in contact regions 7b, 8b.

In order to form the above shallow junction regions 7a, 8a and the contact regions 7b, 8b, sidewalls 9 are formed on gate sidefaces. Here, the gate to be provided with sidewalls 9 means an entire portion constituted by the tunnel insulation film 3, the charge retention layer 4, the gate insulation film 5 and the control gate 6. This definition is applied hereinafter. These side walls 9 also serve to decrease overlap regions of the gate with the source region 7 and the drain region 8, particularly overlap regions of the gate with the contact regions 7a, 8b being high concentration impurity regions. By decreasing overlap regions, it is possible to decrease parasitic capacitance formed in these regions, and to provide effects of high speed operation and low power consumption of the element. Further, for the purpose of suppressing leakage between the source and the drain in a microelement, it is preferred to form a halo ion implantation region 10.

As described above, in the process for producing nonvolatile semiconductor memory element according to the embodiment of the present invention, in a nonvolatile semiconductor memory element having a construction that a hardly oxidizable material composed of e.g. W, Ni or Co is used as a ultrafine particle floating gate or a single floating gate, and an oxide of an easily oxidizable material such as $SiO_2$ is used as an insulator surrounding the floating gate, wherein the ultrafine particle floating gate or the single floating gate and the insulator are simultaneously formed by using a physical forming method, it is possible to bond oxygen atoms with e.g. oxygen shortage type defects or free valencies in an insulator such as $SiO_2$ while the ultrafine particle floating gate or the single floating gate is not oxidized or while it is reduced, whereby it is possible to improve insulation performance of the insulator surrounding the floating gate such as the metal ultrafine particle floating gate, and to decrease the ratio of oxidized ultrafine particles in the floating gate, and it is possible to produce a nonvolatile semiconductor memory element having high charge retention performance.

Further, in a nonvolatile semiconductor memory element having a construction that a hardly oxidizable material composed of e.g. W, Ni or Co is used as an ultrafine particle floating gate or a single floating gate and an oxide of an easily oxidizable material such as $SiO_2$ is used as an insulator surrounding the floating gate, wherein the ultrafine particle floating gate or the single floating gate is formed by using a physical forming method, it is possible to bond oxygen atoms with oxygen shortage type defects or free valencies in an insulator such as $SiO_2$ while the ultrafine particle floating gate or the single floating gate is not oxidized or while it is reduced, whereby it is possible to improve insulation performance of the insulator surrounding the floating gate such as the metal ultrafine particle floating gate, and to decrease the ratio of oxidized metal ultrafine particles in the floating gate, and it is possible to produce a nonvolatile semiconductor memory element having high charge retention performance.

Further, in a nonvolatile semiconductor memory element having a construction that a hardly oxidizable material composed of e.g. W, Ni or Co is used as an ultrafine particle floating gate or a single floating gate, and an oxide of an easily oxidizable material such as $SiO_2$ is used as an insulator surrounding the floating gate, wherein the ultrafine particle floating gate or the single floating gate is formed by using a physical forming method, and wherein after a first insulator formed simultaneously with the floating gate is selectively removed, a second insulator is formed by using a physical forming method or a chemical forming method; it is possible to bond oxygen atoms with oxygen shortage type defects or free valencies in an insulator of e.g. $SiO_2$ while the ultrafine particle floating gate or the single floating gate is not oxidized or while it is reduced, whereby it is possible to improve insulation performance of the insulator surrounding the floating gate such as the metal ultrafine particle floating gate, and to decrease the ratio of oxidized metal ultrafine particles in the floating gate, and to thereby produce a nonvolatile semiconductor memory element having high charge retention performance.

Further, since an oxide of the first easily oxidizable material containing relatively large amount of defects due to oxygen shortage such as $SiO_2$ in a tentative forming layer formed by a physical forming method, is selectively removed and since an oxide of the second easily oxidizable material having less defects due to oxygen shortage, is subsequently deposited, it is possible to produce a nonvolatile semiconductor memory element having further few defects due to oxygen shortage.

Further, in a range of from 0° C. to 1,200° C., the oxidizing gas appropriately oxidizes the easily oxidizable material such as Si without oxidizing the ultrafine particle floating gate or the single floating gate, and the reducing gas can appropriately reduce the ultrafine particle floating gate or the single floating gate without reducing the oxide of easily oxidizable material such as $SiO_2$, and accordingly, it is possible to regulate oxidation power of the oxidizing gas to be used and reducing power of the reducing gas to be used, to suitably carry out the heat treatments of the above oxidation and reduction, and to thereby produce a nonvolatile semiconductor memory element having high charge retention performance.

Further, since hydrogen and water vapor, that have sufficient experience of use in a field of semiconductor is element manufacturing and easy to be handled, are used as mixed gases for oxidation and reduction, it is possible to produce a nonvolatile semiconductor memory element having high charge retention performance easily and safely with good reproducibility.

Further, after the oxidation reduction treatment is carried out, a heat treatment is carried out in a predetermined inert atmosphere or under reduced-pressure, it is possible to effectively remove by-products such as OH groups which may remain after the oxidation-reduction treatment in the production of nonvolatile semiconductor memory element. Here, the OH groups which may remain after the oxidation-reduction treatment, may cause adverse effect such as lowering of melting point of the oxide or deterioration of insulation properties.

As described above, the nonvolatile semiconductor memory element according to the embodiment of the present invention, has an effect produced by the process for producing nonvolatile semiconductor memory element of the present invention, and has high charge retention performance and element performance.

EXAMPLES

Specific Examples based on the above-mentioned embodiments of the present invention, are described below.

Example 1

Figure 3:
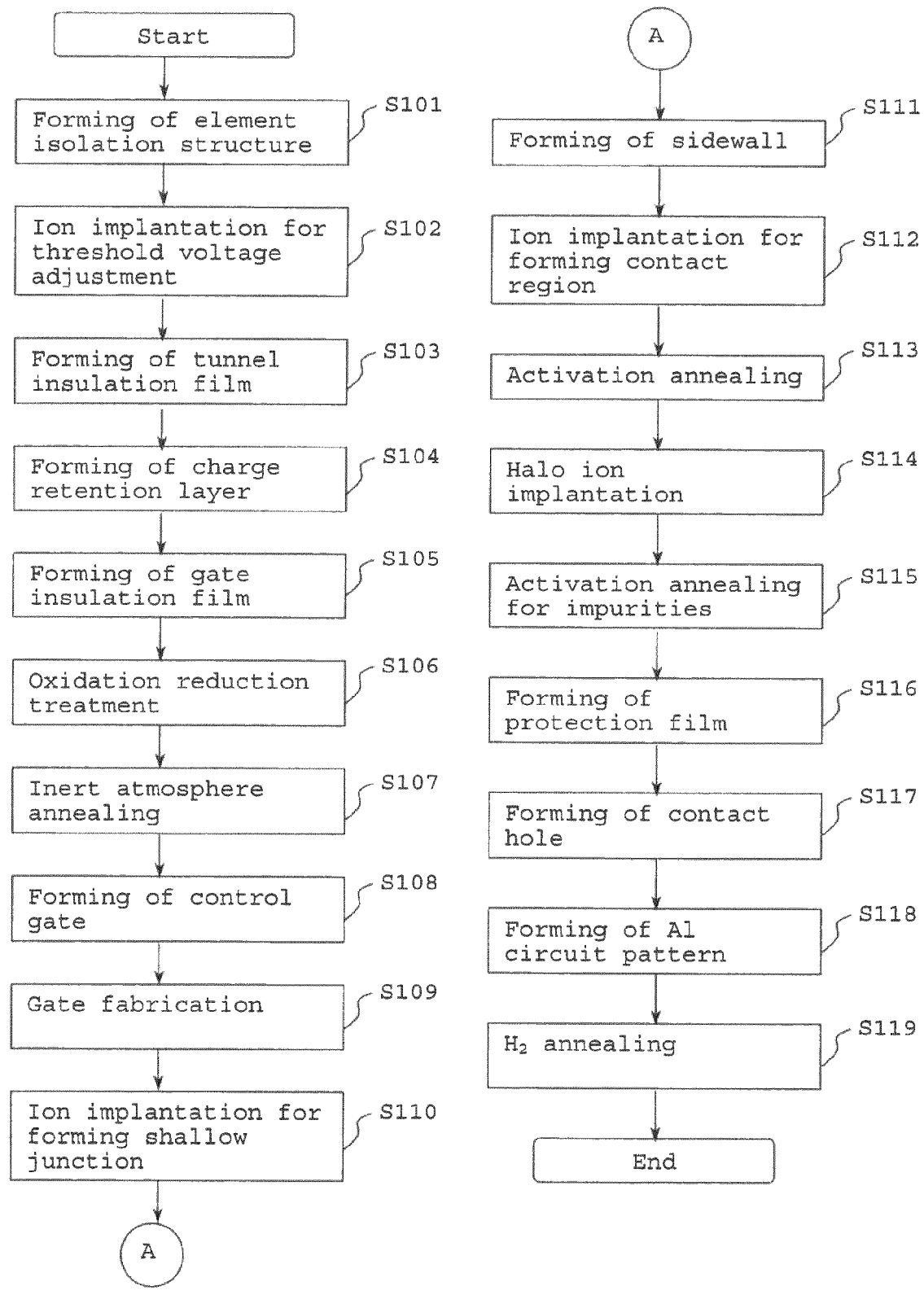
FIG. 3: A flow chart for explaining a production process of nonvolatile semiconductor memory element according to Example 1 of the present invention.

FIG. 3 is a process flow chart for explaining a process for producing nonvolatile semiconductor memory element according to Example 1. In this Example, process steps for producing peripheral circuit portions such as element selection transistors or signal amplification circuit, are omitted, and only process steps for producing memory elements are described.

Figure 4:
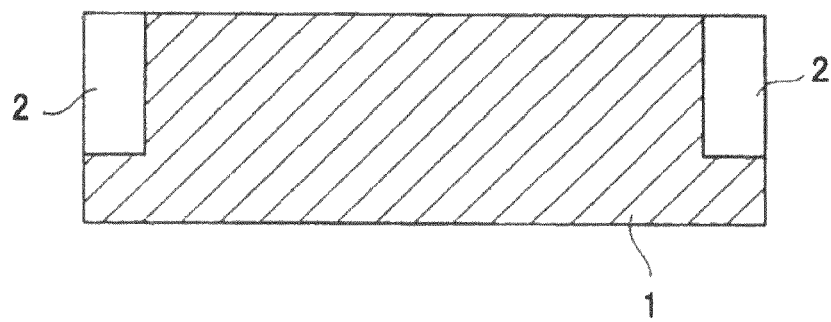
FIG. 4: An explanation view explaining S101 step according to Example 1 of the present invention.
Figure 5:
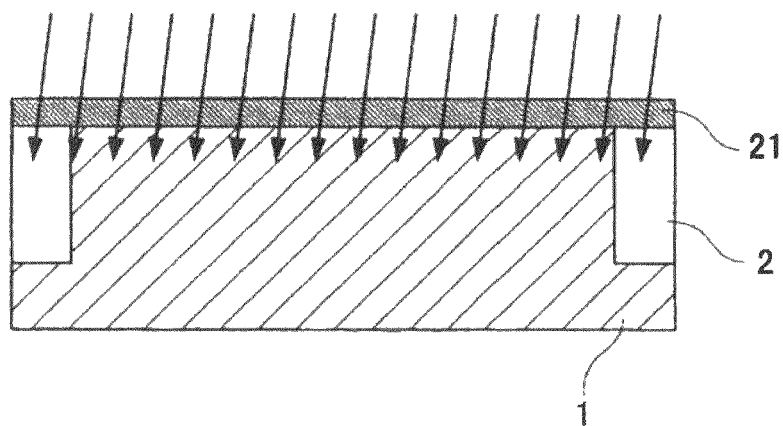
FIG. 5: An explanation view explaining S102 step according to Example 1 of the present invention.

First of all, element isolations 2 are formed on a surface of a semiconductor substrate 1 made of a single crystal Si doped with p-type impurities (S101; refer to FIG. 4). Then, ion implantation for adjusting threshold voltage is carried out (S102; refer to FIG. 5). Here, before this ion implantation, a film called as screen oxide film 21 schematically shown in FIG. 5 is formed by using Si thermal oxidation. As ions to be implanted, $BF_2^+$ ions are employed, and the semiconductor substrate is tilted by 7° to the incident direction of implanted ions so that the implanted ions do not cause channeling of the semiconductor substrate. Here, "channeling" means a phenomenon that implanted ions deeply penetrate into a semiconductor substrate without colliding crystal lattice.

Figure 6:
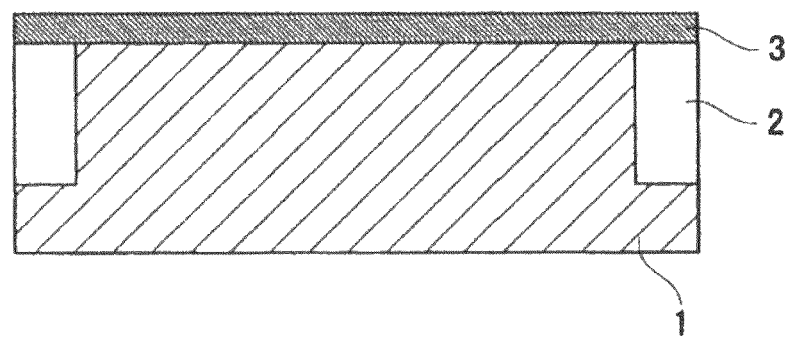
FIG. 6: An explanation view explaining S103 step according to Example 1 of the present invention.

Then, the above screen oxide film 21 is removed so that the surface of the semiconductor substrate 1 is exposed, and a tunnel insulation film 3 is formed on the surface of the semiconductor substrate 1 (S103; refer to FIG. 6). The forming of the tunnel insulation film 3 is carried out by forming a Si thermal oxide film by thermally oxidizing the semiconductor substrate 1 surface in a dry $O_2$ atmosphere. Here, the thickness of the tunnel insulation film 3 is 3 nm.

Figure 7:
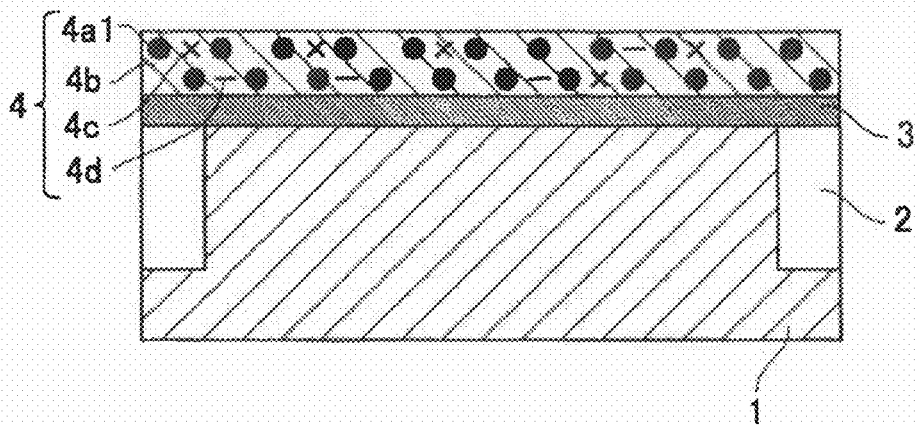
FIG. 7: An explanation view explaining S104 step according to Example 1 of the present invention.

Then, on the tunnel insulation film 3 formed in the step S103, a charge retention layer 4 is formed (S104; refer to FIG. 7). The forming of charge retention layer 4 is carried out by a method of simultaneously sputtering a metal target and an insulator target. By this method, a construction that metal ultrafine particles are densely dispersed in a matrix insulator, is obtained in self-organization manner. As the metal target, a Ni metal plate is employed, and as the insulator target, a $SiO_2$ plate is employed.

Here, the formation free energies of Ni and Si for forming their oxides, are, for example, at a temperature of 800° C., $-286.0$ kJ/mol for Ni (reaction formula: $2Ni+O_2 \rightarrow 2NiO$) and $-717.5$ kJ/mol for Si (reaction formula: $Si+O_2 \rightarrow SiO_2$), and the formation free energy of Si for forming an oxide of Si is lower. Sputtering is carried out under the conditions that the surface area ratio between a Ni target and a $SiO_2$ target is 15:85, the atmospheric gas is Ar, the pressure is 0.5 Pa and the supplied power is 200 W. The thickness of the charge retention layer 4 is made to be 5 nm.

A cross section of the charge retention layer 4 formed under the above conditions, is observed by a transmission electron microscope (TEM), and it is confirmed that Ni ultrafine particles having an average diameter of 2 nm are dispersed in an amorphous $SiO_2$ matrix insulator. Further, using an energy dispersive fluorescent X-ray measurement (EDX), the atomic ratio between Ni elements and Si elements in the formed charge retention layer 4 is measured, and from the value and the diameters of the Ni ultrafine particles, an area density of Ni ultrafine particles are estimated, and as a result, it is $8 \times 10^{12}/cm^2$.

However, from data of Rutherford backscattering (RBS) method, it is confirmed that the number of oxygen atoms is less than twice of the number of Si atoms in the matrix insulator ($SiO_2$) 4b, and that oxygen shortage type defects 4c are present, and from data of electron spin resonance (ESR) method, a resonance absorption peak indicating the presence of free valencies (dangling bonds) 4d is detected.

Figure 8:
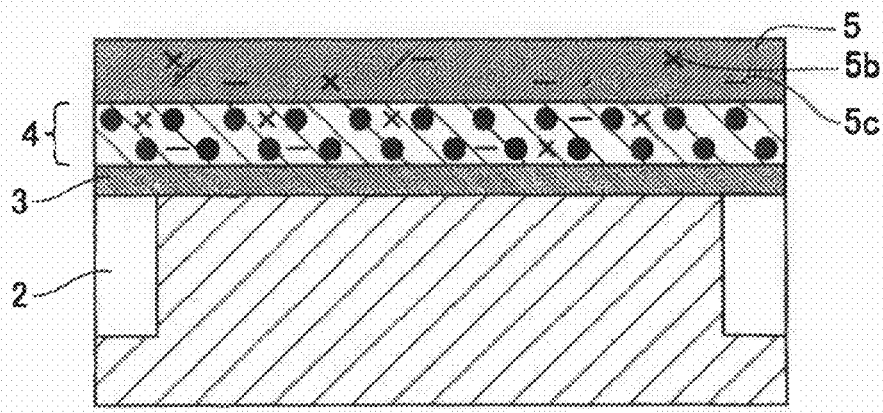
FIG. 8: An explanation view explaining S105 step according to Example 1 of the present invention.

Then, a gate insulation film 5 is formed on the charge retention layer 4 formed in the step S104 (S105; refer to FIG. 8). The forming of gate insulation film 5 is achieved by carrying out sputtering using a $SiO_2$ target in a Ar gas atmosphere under the conditions that the pressure is 0.5 Pa and the supply power is 200 W. Here, the thickness of the gate insulation film is made to be 10 nm. Also with respect to the gate insulation film 5 formed in step S105, evaluation is carried out by Rutherford back scattering (RBS) method and electron spin resonance (ESR) method in the same manner as the above charge retention layer 4, and as a result, it is confirmed that oxygen shortage type defects 5b and free valencies 5c are present.

Figure 9:
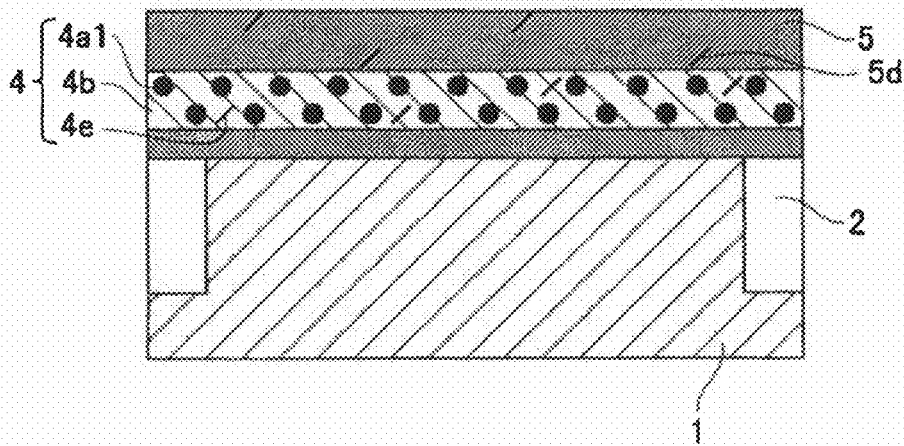
FIG. 9: An explanation view explaining S106 step according to Example 1 of the present invention.

Then, in order to remove the above oxygen shortage type defects 4c, 5b and free valencies 4d, 5c, an oxidation reduction treatment described below is carried out (S106; refer to FIG. 9). An oxidation reduction treatment furnace is heated to 800° C., $H_2$ functioning as a reducing agent is supplied to the oxidation reduction treatment furnace to sufficiently substitute an atmosphere in the oxidation reduction treatment furnace by $H_2$, and thereafter, $H_2O$ gas produced by burning $H_2$ with $O_2$ in an adjacent separate treatment furnace, is supplied so that its flow rate becomes the same as that of $H_2$. In this case, the $H_2$ partial pressure ratio to $H_2O$ in the oxidation reduction treatment furnace is 1, and in this state, Ni is reduced and Si is oxidized as shown in FIG. 2. A sample wafer is moved into the oxidation reduction treatment filled with the above atmosphere, and oxidation treatment is carried out for 30 minutes.

A monitor sample obtained by carrying out the above oxidation reduction treatment is evaluated by a Rutherford back scattering (RBS) method and an electron spin resonance (ESR) method, and as a result, the element number ratio between Si and oxygen is 2 according to the RBS method, and the resonance absorption peak intensity of electromagnetic waves is a background level according to the ESR method, whereby it is confirmed that oxygen shortage type defects 4c, 5b and free valencies 4d, 5c that are present before the oxidation reduction treatment, are disappeared. Further, an evaluation is made by using an electron beam diffraction (ED) method, and as a result, only diffraction pattern of face-centered cubic crystal is detected, but diffraction pattern of Ni oxide such as NiO is not detected, and accordingly, it is confirmed that Ni does not form an oxide by the oxidation reduction treatment but it remained in a state of Ni as it is.

Figure 10:
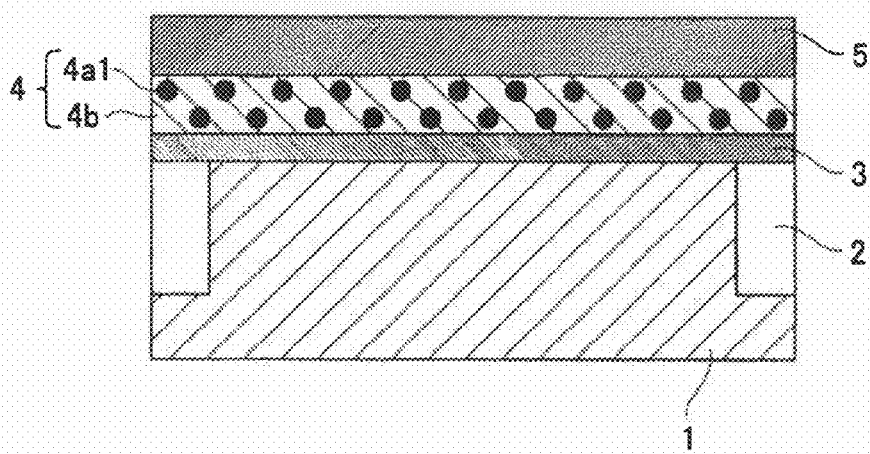
FIG. 10: An explanation view explaining S107 step according to Example 1 of the present invention.

However, when an absorption spectrum of infrared rays is measured by using a Fourier transformation infrared spectrometry (FTIR) method, and as a result, a infrared absorption derived from OH groups 4e in the $SiO_2$ film of the charge retention layer 4 and OH groups 5d in the $SiO_2$ gate insulation film 5, are confirmed. Namely, presence of OH groups in the matrix insulator 4b of the charge retention layer 4 and the gate insulation film 5 are confirmed. In order to remove such OH groups, after the above oxidation reduction treatment is finished, inert atmosphere annealing of the sample wafer is subsequently carried out (S107; refer to FIG. 10).

The inert atmosphere annealing is carried out at 800° C. for 10 minutes after the atmosphere in the oxidation reduction treatment is substituted by $N_2$ gas so that the atmosphere becomes inert. The atmosphere in the oxidation reduction treatment furnace at this time is sampled, and the $H_2$ partial pressure ratio to $H_2O$ is measured by a gas chromatograph spectrometer, and as a result, $H_2$ partial pressure ratio to $H_2O$ is about $10^8$. When a FTIR measurement is carried out by using a monitor sample obtained by the above inert atmosphere annealing in the manner described above, it is confirmed that the infrared absorption derived from OH groups is disappeared.

Figure 11:
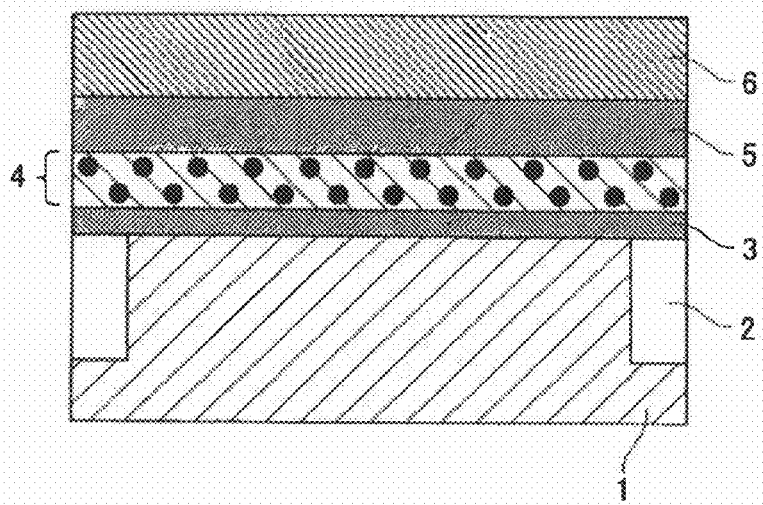
FIG. 11: An explanation view explaining S108 step according to Example 1 of the present invention.

Then, a thin film for control gate 6 is formed on the gate insulation film 5 (S108; refer to FIG. 11). As the thin film for control gate 6, a polycrystal Si film is deposited by using a low pressure CVD (LPCVD) method. At this time, a mixed gas of $SiH_4$ with $PH_3$ is used as a film-forming gas, and P is doped as impurities.

Figure 12:
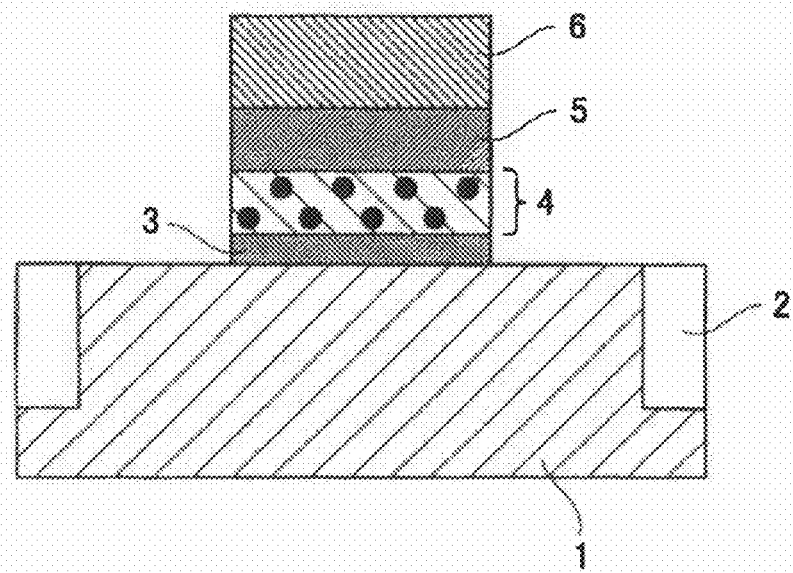
FIG. 12: An explanation view explaining S109 step according to Example 1 of the present invention.

After the thin film for control gate 6 is formed in step S108, gate fabrication is carried out (S109; refer to FIG. 12). The gate fabrication is carried out by forming a resist pattern by an ArF exposure apparatus, and dry etching the thin film for control gate 6, the gate insulation film 5, the charge retention layer 4 and the tunnel insulation film 3 by using a halogen type gas. Subsequently, a wet etching is carried out to completely remove Ni ultrafine particles.

Here, in order to evaluate residual amount of Ni ultrafine particles, a Ni—$SiO_2$ type thin film of 5 nm thick similar to the charge retention layer, is formed, it is subjected to a wet etching treatment similar to one described above, and residual amount of Ni on the surface of the semiconductor substrate 1 after the wet etching treatment is analyzed by a total reflection fluorescent X-ray analysis (TXRF). As a result, the residual amount of Ni is less than detection limit (about $10^9$ atom/cm$^2$), and Ni is not detected.

Figure 13:
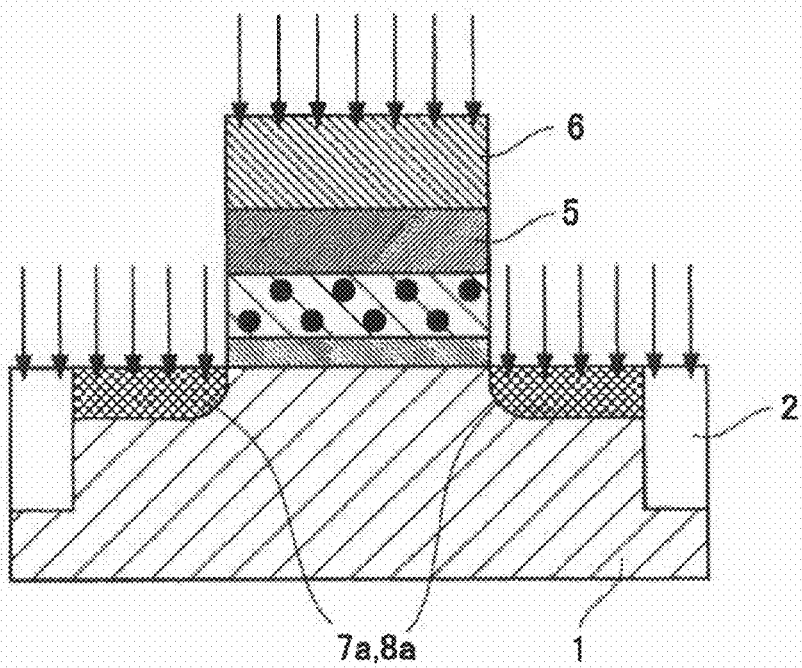
FIG. 13: An explanation view explaining S110 step according to Example 1 of the present invention.
Figure 14:
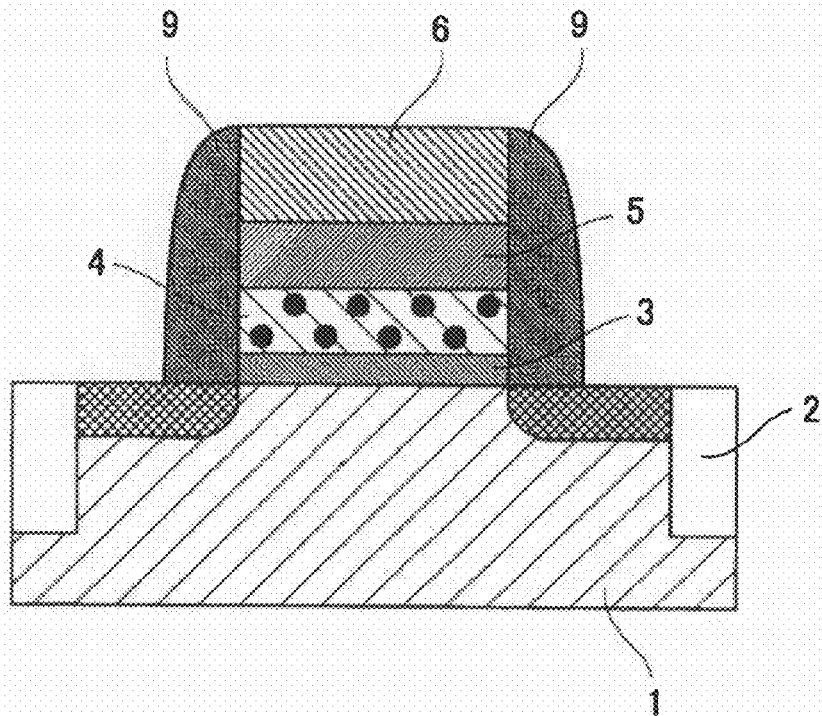
FIG. 14: An explanation view explaining S111 step according to Example 1 of the present invention.
Figure 15:
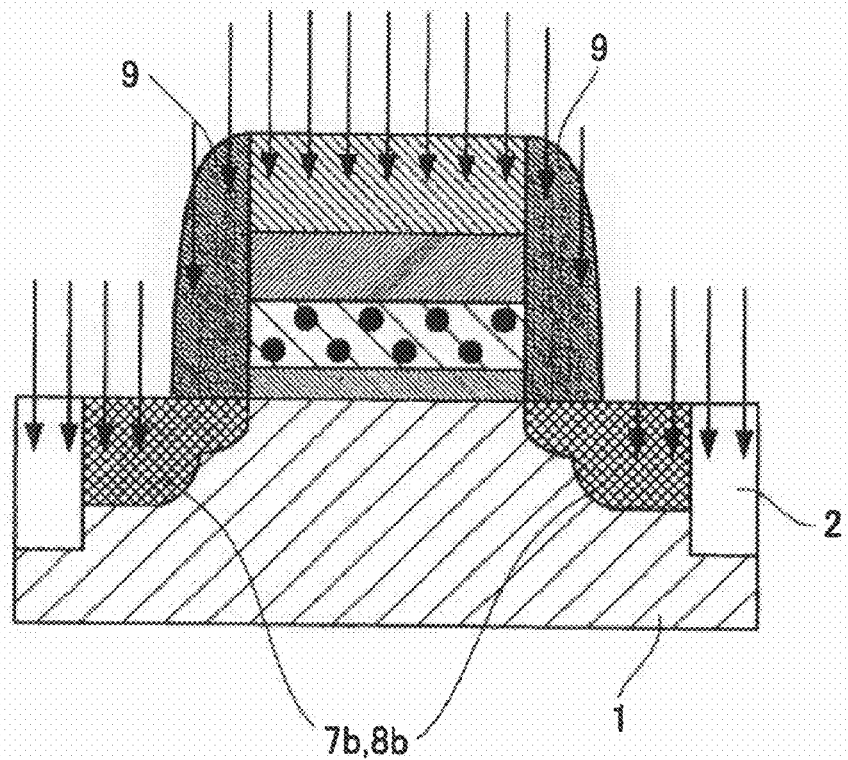
FIG. 15: An explanation view explaining S112 step according to Example 1 of the present invention.

Then, ion implantation is carried out to form shallow junction regions 7a, 8a (S110; refer to FIG. 13). In order to make junction depth shallow, As$^+$ is implanted at low energy so that the range distance of implanted ions becomes short. After ion implantation is carried out in step S110, a SiO$_2$ film is deposited by using a LPCVD method, and the film is subjected to anisotropic etching to form sidewalls 9 (S111; refer to FIG. 14). Then, using these sidewalls 9 as a mask, ion implantation is carried out to form contact regions 7b, 8b (S112; refer to FIG. 15).

The ion implantation for forming the contact regions 7b, 8b is carried out at a high implantation energy to make the injunction depth of the contact regions 7b, 8b deeper than the junction depth of the shallow junction regions 7a, 8a. After ion implantation is carried out in step S112, in order to activate the implanted As, an annealing (hereinafter simply referred to as activation annealing) for activating impurities is carried out by using a RTA (rapid thermal annealing) apparatus in a reduced-pressure atmosphere at 1,000° C. for 5 seconds (S113).

Figure 16:
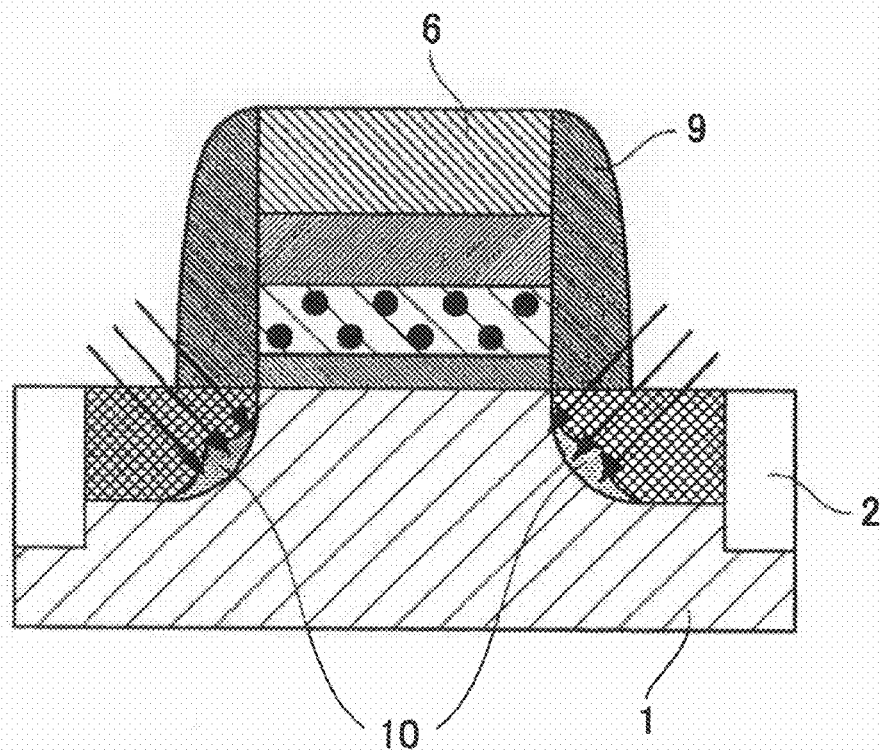
FIG. 16: An explanation view explaining S114 step according to Example 1 of the present invention.

Then, as shown in FIG. 16, BF$_2^+$ ions are implanted from an oblique direction to a normal line to the substrate surface of the semiconductor substrate 1 (S114), and the implanted B (boron) are subjected to an activation annealing (S115) at 800° C. for 10 seconds by using a RTA apparatus, to form halo ion implantation regions 10. Then, NSG (non-doped silica glass) and PSG (phosphorus-doped silica glass) are deposited to form protection films (S116).

Then, contact holes for obtaining electric conductions to the control gate 6 and the contact regions 7b, 8b, are formed (S117), Al circuit pattern for electrically connecting to the control gate 6 and the contact regions 7b, 8b via the contact holes, are formed (S118), and H$_2$ annealing is carried out to improve electric contact between the circuit Al pattern and the Si substrate (S119). A nonvolatile semiconductor memory element employing metal ultrafine particles as a floating gates obtained in the manner described above, has a charge retention performance of at least 20 years in a temperature environment of 200° C., and has a rewritable performance of more than 106 times.

Example 2

Figure 17:
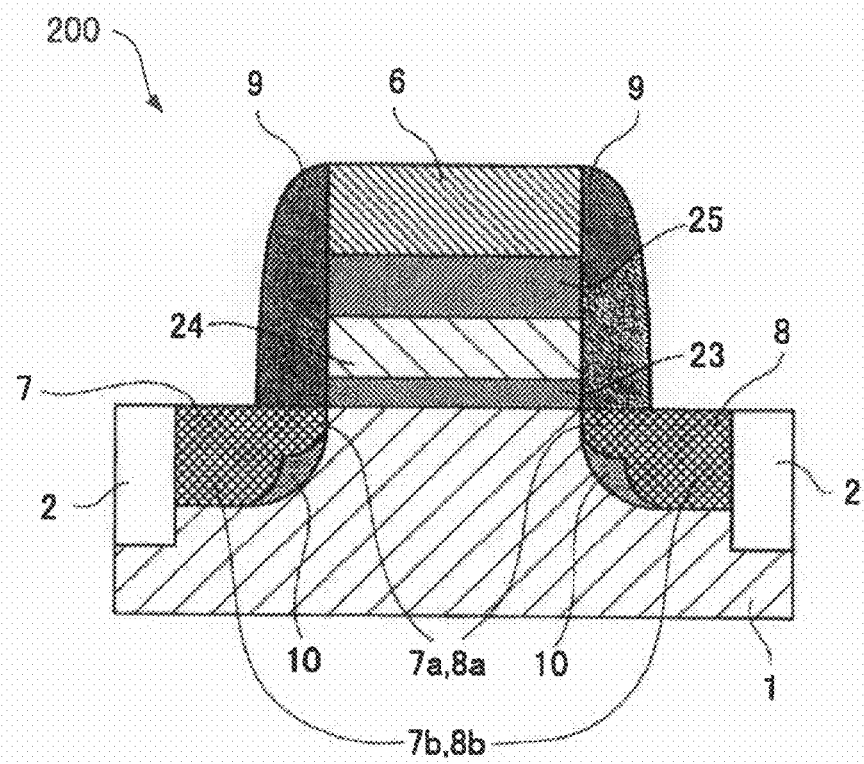
FIG. 17: An explanation view schematically showing an example of cross sectional structure of a nonvolatile semiconductor memory element according to Example 2 of the present invention.

FIG. 17 is an explanation view schematically showing an example of cross sectional structure of a nonvolatile semiconductor memory element according to Example 2. First of all, in the same manner as explained in Example 1, on a surface of a semiconductor substrate 1 made of single crystal Si doped with p-type impurities, element isolations 2 are formed (S101; refer to FIG. 4), and ion implantation is carried out to adjust threshold voltage (S102; refer to FIG. 5).

Figure 18:
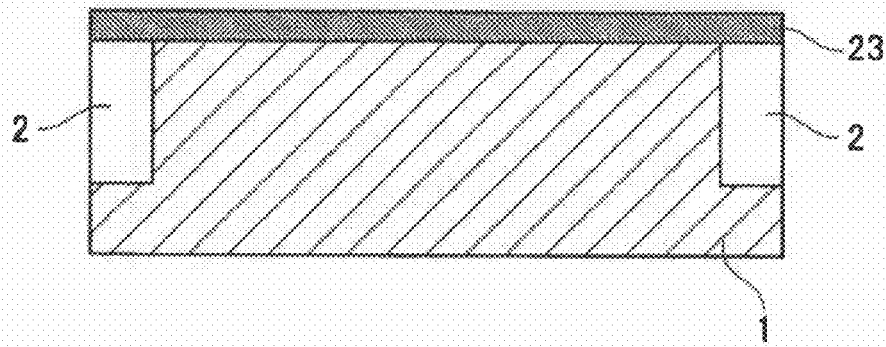
FIG. 18: An explanation view explaining S103 step according to Example 2 of the present invention.

Then, the above-mentioned screen oxide film 21 (refer to FIG. 5) is removed so that the surface of the semiconductor substrate 1 is exposed, and a tunnel insulation film 23 is formed on the surface of the semiconductor substrate 1 (S103; refer to FIG. 18). The forming of the tunnel insulation film 23 is carried out by thermally oxidizing and nitriding the surface of the semiconductor substrate 1 in a N$_2$O atmosphere to form a SiO$_{0.5}$N film. Here, the thickness of the tunnel insulation film 23 is made to be 3 nm.

Figure 19:
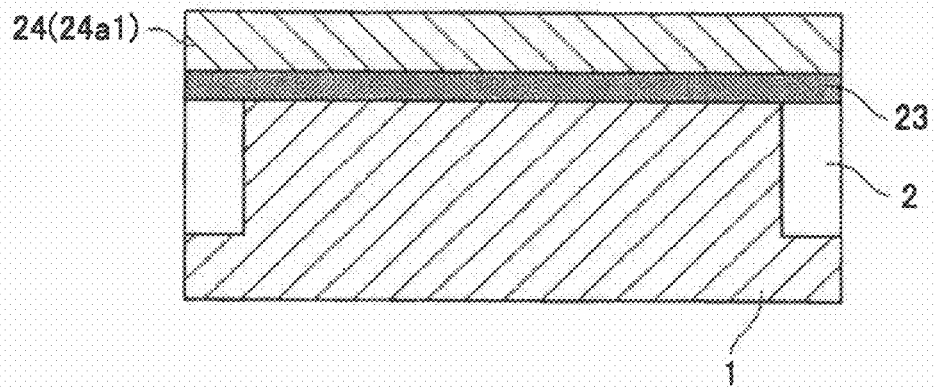
FIG. 19: An explanation view explaining S104 step according to Example 2 of the present invention.

Then, on the tunnel insulation film 23 formed in step S103, a charge retention layer 24 is formed (S104; refer to FIG. 19). The charge retention layer 24 is formed by sputtering a Co target to deposit a Co thin film. Namely, the floating gate according to Example 2 is not a large number of isolated ultrafine particles but a single thin film-shaped floating gate.

Figure 20:
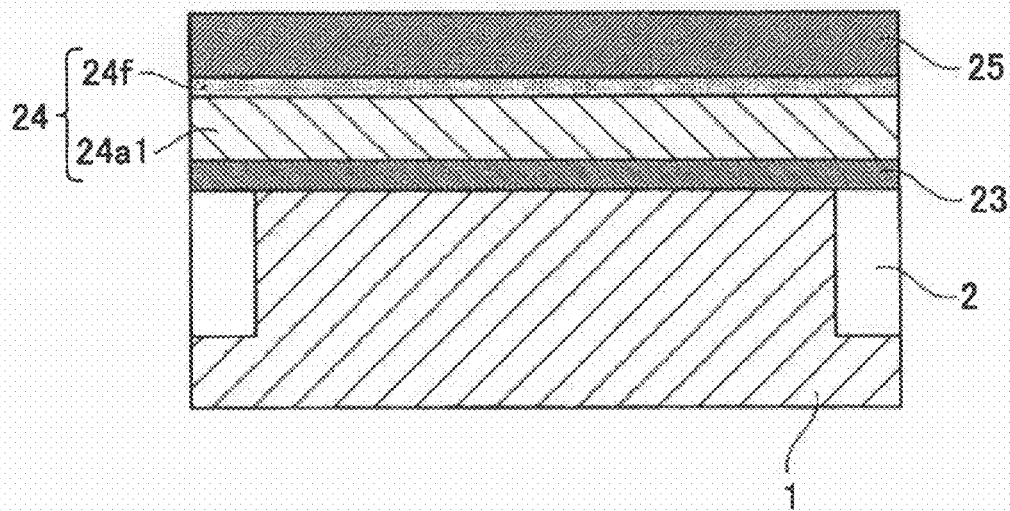
FIG. 20: An explanation view explaining S105 step according to Example 2 of the present invention.

Then, on the charge retention layer 24 formed in step S104, a gate insulation film 25 is formed (S105; refer to FIG. 20). The forming of gate insulation film 25 is achieved by forming a SiO$_2$ film by using a LPCVD method and using a mixed gas of evaporated TEOS (tetraethoxysilane) and oxygen as a raw material.

Here, the thickness of the gate insulation film 25 is made to be 10 nm.

Here, the formation free energies of Co and Si for forming their oxides are, for example, at 800° C., −316.6 kJ/mol for Co (reaction formula: $2Co+O_2 \rightarrow 2CoO$) and −717.5 kJ/mol for Si (reaction formula: $Si+O_2 \rightarrow SiO_2$), and the formation free energy of Si for forming an oxide of Si is lower. Forming of the above SiO$_2$ film is carried out at relatively high temperature, and thus, a Co thin film 24a1 of the charge retention layer 24 is entirely or partially oxidized, to form an oxidized portion 24f (refer to FIG. 20).

Figure 21:
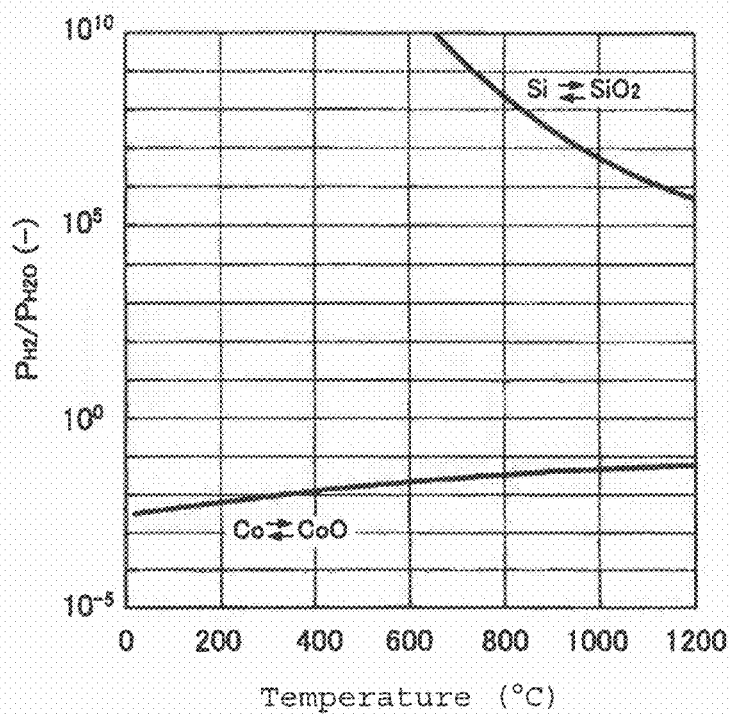
FIG. 21: A view explaining oxidation reduction conditions in a construction that ultrafine particles are made of CoO and matrix insulator is made of $SiO_2$.
Figure 22:
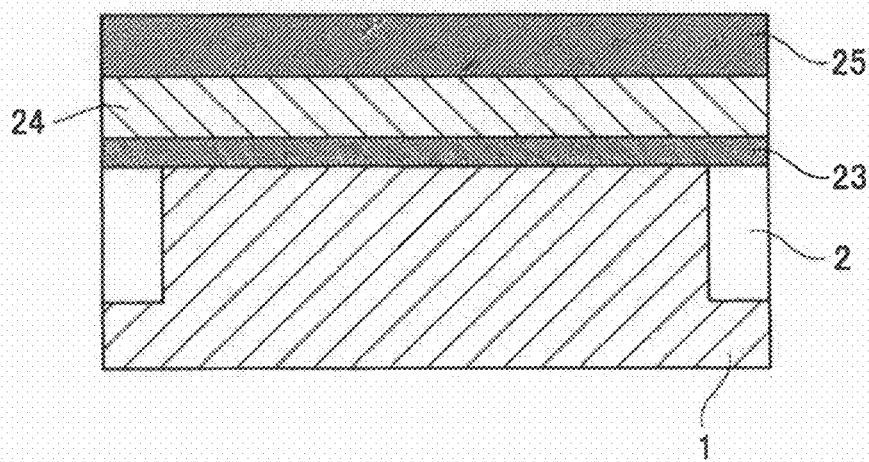
FIG. 22: An explanation view explaining S106 step and S107 step according to Example 2 of the present invention.

Then, in order to remove the above oxidized portion 24f by reduction, an oxidation reduction treatment described below is carried out (S106; refer to FIG. 22). FIG. 21 is a view for explaining oxidation reduction conditions in a construction that a floating gate and an insulator surrounding the floating gate are made of Co and SiO$_2$ respectively. It is understandable from FIG. 21 that in a case of carrying out oxidation reduction treatment for oxidizing Si and reducing Co at 800° C., it is sufficient that the H$_2$ partial pressure to H$_2$O is set to be about 1. This treatment condition can be applicable in the same manner also to cases of moving a sample into and out from the oxidation reduction treatment furnace.

The atmosphere in the oxidation reduction treatment furnace is realized in the following manner. First of all, H$_2$ functioning as a reducing agent is supplied into the oxidation reduction treatment furnace to sufficiently substitute the atmosphere by H$_2$, and subsequently, H$_2$O produced by burning H$_2$ with O$_2$ is supplied so that H$_2$ partial pressure to the H$_2$O becomes 1. Then, in order to carry out oxidation reduction treatment, in this state, a sample wafer is moved into the oxidation reduction treatment, and held there for 30 minutes. Subsequently, an inert atmosphere annealing is carried out in N$_2$ atmosphere at 800° C. for 10 minutes to remove OH groups formed in the gate insulation film 25 (refer to FIG. 22).

Then, in the same manner as explained in Example 1 of the present invention, a thin film for control gate 6 is formed (S108), a gate fabrication is carried out (S109) and ion implantation is carried out (110) to form shallow junction regions 7a, 8a. Then, sidewalls 9 are formed (S111), ion implantation is carried out to form contact regions 7b, 8b (S112), an activation annealing is carried out by using a RTA apparatus (S113), ion implantation is carried out to form halo ion implantation regions 10 (S114) and an activation annealing is carried out again by using a RTA apparatus (S115; refer to FIG. 23).

Figure 23:
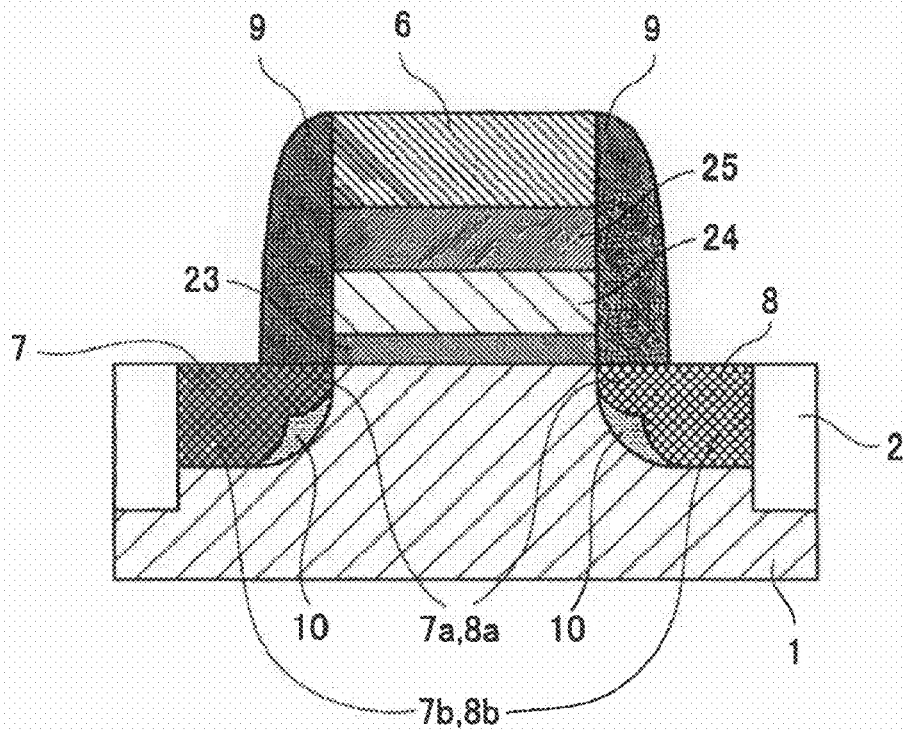
FIG. 23: A view schematically showing a cross sectional structure of an element after S115 step according to Example 2.

FIG. 23 is a view schematically showing a cross sectional structure of an element after completion of the step for forming halo ion implantation regions 10 (S114) and the step of activation annealing (S115) in the process for producing nonvolatile semiconductor memory element according to Example 2 of the present invention. When the above halo ion implantation regions 10 are formed, in the same manner as one explained in Example 1 of the present invention, NSG and PSG are deposited as protection films (S116), contact holes are formed (S117), Al circuit pattern is formed (S118) and H$_2$ annealing is carried out to improve electric contact between the Al circuit pattern and the Si substrate (S119). A nonvolatile semiconductor memory element employing a Co thin film as a floating gate obtained in the following process has a charge retention performance of at least 20 years in a temperature environment of 200° C.

Example 3

Figure 24:
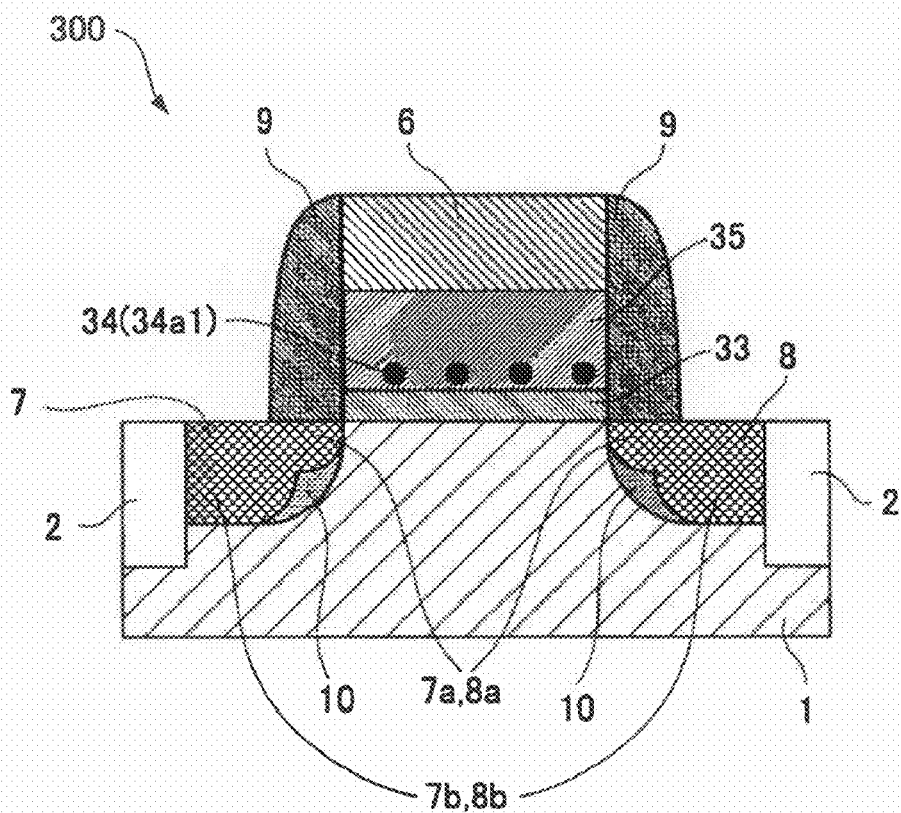
FIG. 24: An explanation view schematically showing an example of cross sectional structure of a nonvolatile semiconductor memory element according to Example 3 of the present invention.

FIG. 24 is an explanation view schematically showing an example of cross sectional structure of a nonvolatile semiconductor memory element according to Example 3 of the present invention. First of all, in the same manner as ones explained in Example 1 and Example 2 of the present invention, on a surface of a semiconductor substrate 1 made of single crystal Si doped with p-type impurities, element isolations 2 of STI type are formed (S101; refer to FIG. 4), and ion implantation for adjusting threshold voltage is carried out (S102).

After removing a screen oxide film, a tunnel insulation film 33 made of a HfO$_2$ silicate (HfSi$_x$O$_y$) type high dielectric material is formed in Example 3 of the present invention. The tunnel insulation film 33 of HfO$_2$ silicate type is formed by a sputtering method, and the film thickness is made to be 3 nm. By employing such a high dielectric material for the tunnel insulation film 33, short-channel effect can be suppressed and it becomes easy to selectively remove only matrix insulator in a selective removal step of matrix insulator in a tentative forming layer to be described later. More detail explanation of this effect is as follows. When a tunnel insulation film is made of the same material as that of matrix insulator such as SiO$_2$, the tunnel insulation film is inevitably partially removed at a time of removing the matrix insulator. However, when the materials of the matrix insulator and the tunnel insulation film are different, for example, when they are SiO$_2$ and a high dielectric material such as HfO$_2$ silicate type material respectively, it becomes possible to selectively remove only matrix insulator in the tentative forming layer and to completely retain the tunnel insulation film without being removed. When the selectivity for removing the matrix insulator is low in such as a case where the tunnel insulation film and the matrix insulator are the same material, the film thickness of the tunnel insulation film becomes excessively thinner than its design value, and the variation of the film thickness increases, causing deterioration of charge retention properties of the element and increase of variation of threshold voltage. In order to avoid such problems, in a nonvolatile semiconductor memory element of this example whose production process includes a step of removing matrix insulator in a tentative forming layer, it is extremely preferred to apply a material different from that of the matrix insulator to the tunnel insulation film.

Figure 25:
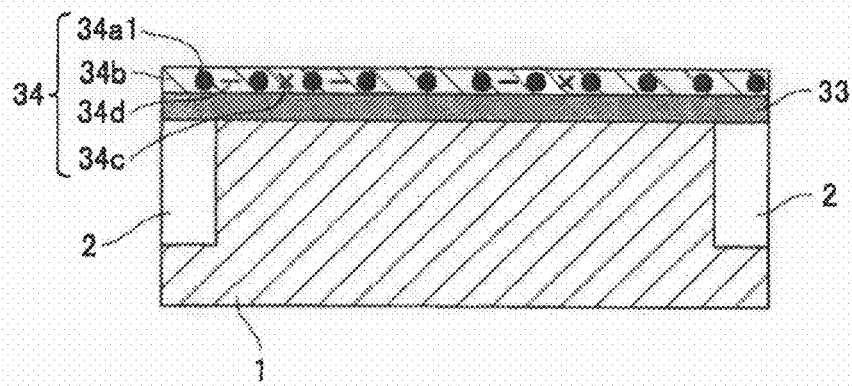
FIG. 25: An explanation view explaining S104 step according to Example 3 of the present invention.

Then, on the tunnel insulation film 33 formed in step S103, a charge retention layer 34 as a tentative forming layer is formed (S104; refer to FIG. 25). The forming of charge retention layer 34 is carried out in the same manner as that explained in Example 1 under the condition that a W metal plate is employed as a metal target, a SiO$_2$ plate is employed as an insulator target and the ratio of surface area between these targets is set to 15:85. Here, the formation free energies of W and Si for forming their oxides are, for example at 750° C., −403.4 kJ/mol for W (reaction formula: W+O$_2$→WO$_2$) and −726.2 kJ/mol for Si (reaction formula: Si+O$_2$→SiO$_2$), and the formation free energy of Si for forming the oxide of Si is lower.

A cross section of the charge retention layer 34 formed under the above conditions is observed by using a transmission electron microscope (TEM), and as a result, it is confirmed that W ultrafine particles having an average diameter of 2 nm are dispersed in a SiO$_2$ matrix insulator. Further, using an energy dispersive fluorescent X-ray measurement (EDX), the atomic ratio between W elements and Si elements in the formed charge retention layer 34 is measured, and from the value and the diameters of the W ultrafine particles, an area density of W ultrafine particles are estimated, and as a result, it is $8 \times 10^{12}/cm^2$.

However, according to the data of Rutherford backscattering (RBS) method, it is confirmed that the number of oxygen atoms is less than twice as the Si atoms in the SiO$_2$ matrix insulator 34$b$, and that oxygen shortage type defects 34$c$ are present, and from the data of electron spin resonance (ESR) method, a resonance absorption peak indicating the presence of free valencies (dangling bonds) 34$d$ is detected.

Figure 26:
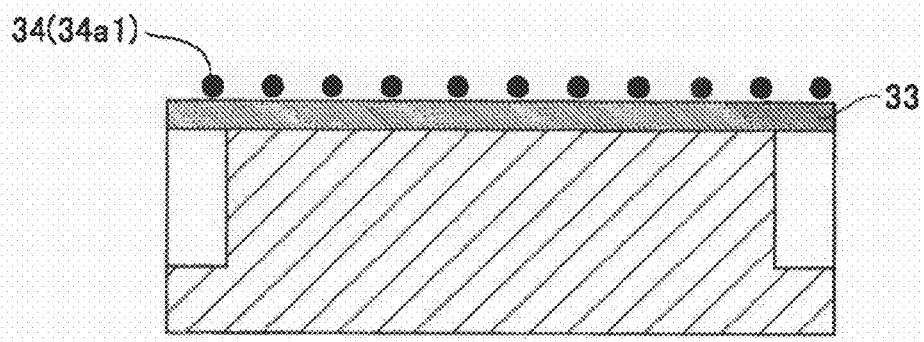
FIG. 26: An explanation view illustrating selective removal of $SiO_2$ matrix insulator according to Example 3 of the present invention.

Then, the SiO$_2$ matrix insulator 34$b$ of the charge retention layer 34 as the tentative forming layer formed on the tunnel insulation film 33 is selectively removed and W ultrafine particles 34$a$1 are retained. The selective removal of the SiO$_2$ matrix insulator 34$b$ is carried out by dry etching using a CF$_4$+H$_2$ type gas as an etching gas (refer to FIG. 26).

Figure 27:
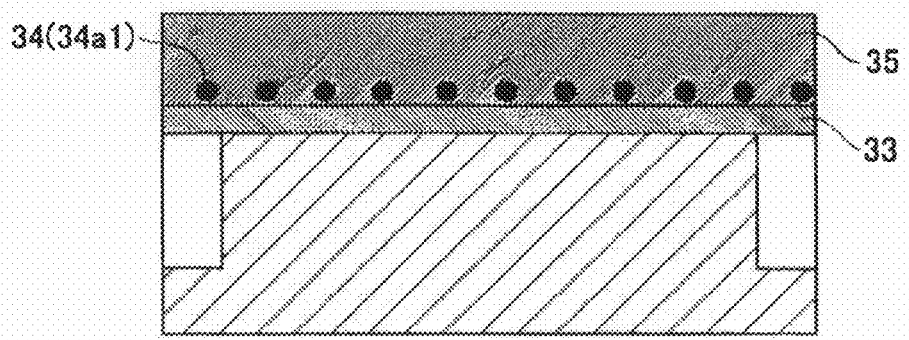
FIG. 27: An explanation view illustrating S105 step according to Example 3 of the present invention.

Then, on the charge retention layer 34 formed in step S104, a gate insulation film 35 is formed (S105; refer to FIG. 27). Forming of the gate insulation film 35 is carried out by forming a SiO$_2$ film by a LPCVD method using a mixed gas of evaporated TEOS and oxygen as a raw material. Here, the thickness of the gate insulation film 35 is made to be 10 nm. Since the forming of SiO$_2$ film is carried out at relatively high temperature, W ultrafine particles 34$a$1 is entirely or partially oxidized to form an oxidized portion.

Figure 28:
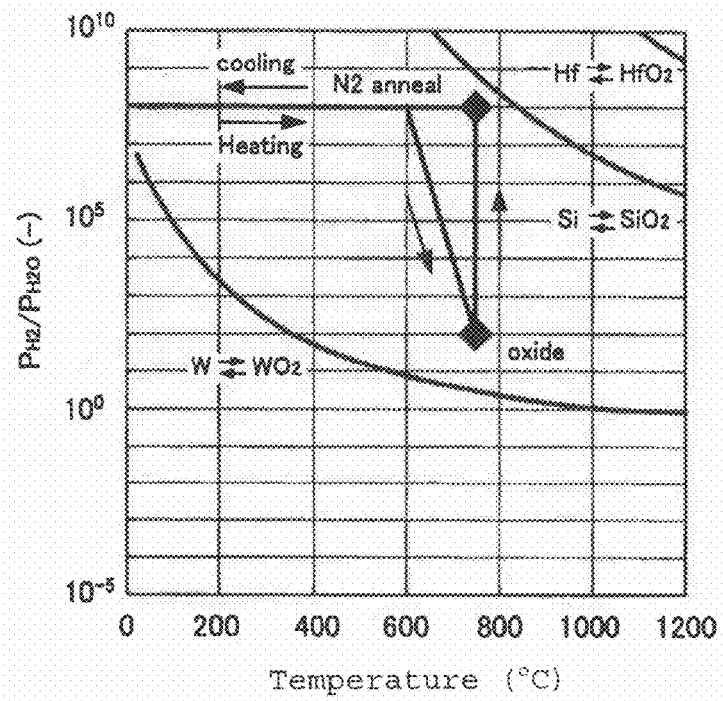
FIG. 28: A view illustrating oxidation reduction conditions in a construction that ultrafine particles are made of W, tunnel insulation film is made of high dielectric constant material of $HfO_2$ silicate type and gate insulation film is made of $SiO_2$.

Then, in order to reduce the above oxidized portion, an oxidation reduction treatment to be described later is carried out (S106). FIG. 28 is a view for illustrating oxidation reduction conditions in a construction that ultrafine particles are made of W, the tunnel insulation film is made of a high dielectric material of HfO$_2$ silicate type, and the gate insulation film is made of SiO$_2$. It is understandable from FIG. 28 that in a case of carrying out the oxidation reduction treatment for oxidizing Si and Hf and reducing W in an oxidation reduction treatment furnace at a temperature of 750° C., it is sufficient that the H$_2$ partial pressure ratio to H$_2$O is set to be in a wide range of from about $10^1$ to $10^8$.

However, at times of moving a sample wafer into and out from the oxidation reduction treatment furnace, since the temperature of the sample wafer drops to a room temperature, it is necessary to make the H$_2$ partial pressure to H$_2$O to about $10^7$ or more (H$_2$O concentration is about 0.1 ppm or lower). In order to appropriately carry out oxidation reduction in a range of from room temperature to the temperature of oxidation reduction, the H$_2$ partial pressure ratio to H$_2$O and the temperature are controlled so that they change along the path shown in FIG. 28.

First of all, inside of the oxidization reduction treatment furnace is evacuated to a pressure of about $10^{-3}$ Pa or lower, and thereafter, H$_2$ is supplied into the oxidation reduction treatment furnace to make the pressure to 1 atm. By this treatment, the H$_2$ partial pressure ratio to H$_2$O in the oxidation reduction treatment furnace becomes about $10^8$ or more, in other words, H$_2$O becomes about 10 ppb or lower. In this state, the sample wafer is moved into the oxidation reduction treatment furnace and the temperature is raised to 600° C. while the atmosphere is maintained.

Then, until the temperature rises to 750° C. being an oxidation reduction treatment temperature, H$_2$O gas produced by burning $H_2$ with $O_2$ in an adjacent separate treatment furnace is supplied into the oxidation reduction treatment furnace so that its flow rate gradually increases, and so that the $H_2$ partial pressure to $H_2O$ becomes about $10^2$ when the temperature reaches 750° C. In this state, oxidation reduction treatment is carried out for 30 minutes. Subsequently, the atmosphere in the oxidation reduction treatment furnace is substituted by $N_2$ atmosphere, and an inert atmosphere annealing for removing OH groups is carried out for 10 minutes. The atmosphere in the oxidation reduction treatment furnace at this time is sampled, and its $H_2$ partial pressure ratio to $H_2O$ is measured by using a gas chromatography analyzer, and as a result, the $H_2$ partial pressure $H_2O$ is about $10^8$. Then, maintaining the atmosphere in this state, the sample wafer is moved to a region of low temperature in the oxidation reduction treatment furnace and cooled to a room temperature.

Figure 29:
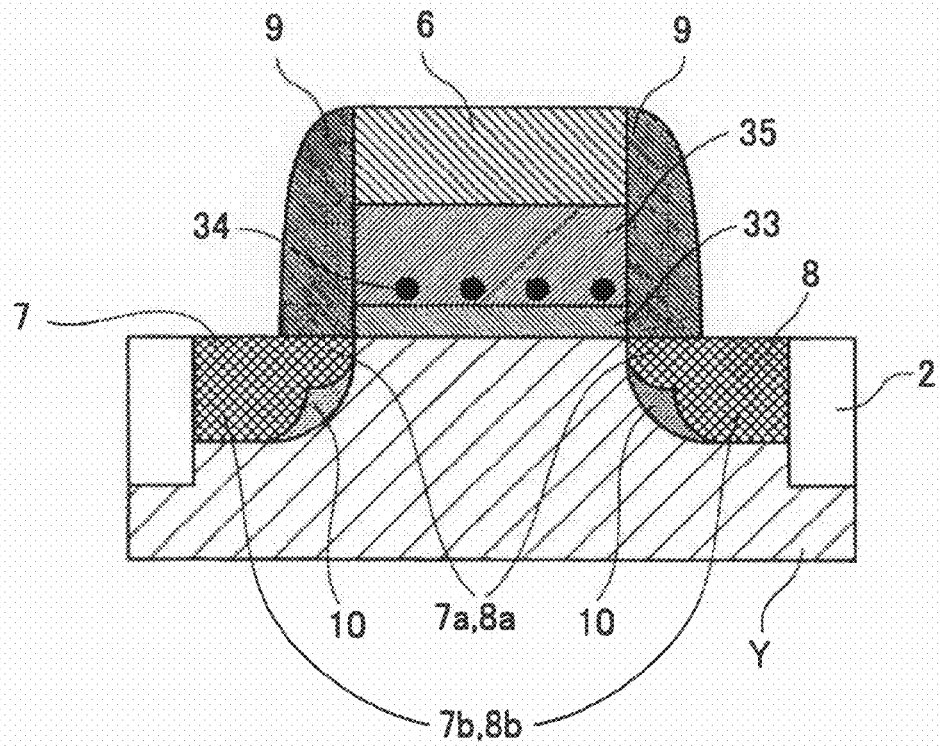
FIG. 29: A view schematically showing a cross sectional structure of the element after S115 step according to Example 3 of the present invention.

Then, in the same manner as one explained in Example 1 of the present invention, a thin film for control gate 6 is formed (S108), a gate fabrication is carried out (S109), and ion implantation is carried out to form shallow junction regions 7a, 8a (S110). Here, the gate length is made to 65 nm by using an electron beam exposure apparatus. Then, sidewalls 9 are formed (S111), ion implantation is carried out to form contact regions 7b, 8b (S112), an activation annealing is carried out by using a RTA apparatus (S113), ion implantation is carried out to form halo ion implantation regions 10 (S114), and an activation annealing is carried out again by using a RTA apparatus (S115). FIG. 29 shows a schematic cross sectional view of an element after the activation annealing (S115) is completed.

Then, in the same manner as one explained in Example 1, NSG and PSG are deposited as protection films (S116), contact holes are formed (117), Al circuit pattern is formed (S118), and $H_2$ annealing is carried out to improve electric contact between the Al pattern and the Si substrate (S119).

Detail of the process from the above deposition of control gate 6 to the above $H_2$ annealing, are the same as those explained in Examples 1 and 2 except for the gate fabrication step. A nonvolatile semiconductor memory element employing W ultrafine particles as floating gates having a gate length of 65 nm obtained by the above process, has a charge retention performance of at least 20 years in a temperature environment of 200° C., and has a to e.g. production process of nonvolatile semiconductor memory elements of other memory methods, such as ferroelectric memories (FeRAMs) or MRAMs.

The entire disclosure of Japanese Patent Application No. 2005-263792 filed on Sep. 12, 2005 including specification, claims, drawings and summary is incorporated herein by reference in its entirety.

What is claimed is:

1. A process for producing a nonvolatile semiconductor memory element having a mixed or laminated structure of a hardly oxidizable material composed of a hardly oxidizable element having a Gibbs' formation free energy for forming oxide higher than the Gibbs' formation free energy of Si for forming oxide under the same temperature condition at 1 atm and in a temperature range of from 0° C. to 1,200° C. and an oxide of an easily oxidizable material composed of an element having a Gibbs' formation free energy for forming oxide lower than the Gibbs' formation free energy of Si for forming oxide under the same temperature condition at 1 atm in the temperature range of from 0° C. to 1,200° C., and Si, the process comprising:

forming a portion made of the hardly oxidizable material and a portion made of the oxide of the easily oxidizable material by a physical forming method; and carrying out a heat treatment in a mixed gas of an oxidizing gas functioning as an oxidizing agent and a reducing gas functioning as a reducing agent, wherein the mixture ratio of the oxidizing gas and the reducing gas and the temperature are controlled so that the hardly oxidizable material is reduced and the oxide of the easily oxidizable material is oxidized in a temperature range of from 0° C. to 1,200° C.

2. The process for producing a nonvolatile semiconductor memory element according to claim 1, wherein change amount of Gibbs' free energy of the oxidizing gas required for oxidation reaction with the easily oxidizable material is negative in the temperature range of from 0° C. to 1,200° C., change amount of Gibbs' free energy of the reducing gas required for reduction reaction with the oxide of the hardly oxidizable material is negative in the temperature range of from 0° C. to 1,200° C., and change amount of Gibbs' free energy of the reducing gas required for reduction reaction with the oxide of the easily oxidizable material is positive in the temperature range.

3. The process for producing a nonvolatile semiconductor memory element according to claim 1, wherein the oxidizing gas contains $H_2O$ and the reducing gas contains $H_2$.

4. The process for producing a nonvolatile semiconductor memory element according to claim 1, wherein the heat treatment is carried out in a mixed gas of the oxidizing gas and the reducing gas so that the hardly oxidizable material is reduced and the oxide of the easily oxidizable material is oxidized, and subsequently, a further heat treatment is carried out in a predetermined inert gas atmosphere or under a reduced pressure.

5. The process for producing a nonvolatile semiconductor memory element according to claim 4, wherein the heat treatment in an inert gas atmosphere or under a reduced pressure, is carried out at from 600° C. to 900° C.

6. A nonvolatile semiconductor memory element, which is a nonvolatile semiconductor memory element having the hardly oxidizable material, and produced by using the process for producing nonvolatile semiconductor memory element as defined in claim 1.

* * * * *